United States Patent [19]

Murata et al.

[11] Patent Number: 5,361,323

[45] Date of Patent: *Nov. 1, 1994

[54] SIGNAL ENCODING DEVICE

[75] Inventors: Yasumoto Murata; Shuichi Yoshikawa; Yuji Nishiwaki, all of Nara; Shuichi Kawama, Kyoto; Tomokazu Morio, Nara; Atsunori Kitoh, Yamatotakada, all of Japan

[73] Assignee: Sharp Kabushiki Kaisha, Osaka, Japan

[*] Notice: The portion of the term of this patent subsequent to Jun. 28, 2011 has been disclaimed.

[21] Appl. No.: 800,938

[22] Filed: Nov. 29, 1991

[30] Foreign Application Priority Data

Nov. 29, 1990 [JP] Japan ................................. 2-335265
Mar. 11, 1991 [JP] Japan ................................. 3-045199

[51] Int. Cl.⁵ .............................................. G10L 9/18
[52] U.S. Cl. ...................................... 395/2.1; 381/30
[58] Field of Search ................... 381/41, 42, 30; 395/2.1

[56] References Cited

U.S. PATENT DOCUMENTS

4,964,169 10/1990 Ono .................................. 381/40

FOREIGN PATENT DOCUMENTS

3-200999 9/1991 Japan .................................. 381/41
4-3098 1/1992 Japan .................................. 381/41

OTHER PUBLICATIONS

ICASSP '87 Proceedings vol. 3, 6 Apr. 1987, Dallas, Texas, pp. 1354–1357 D. Lin, "Speech Coding Using Efficient Pseudo-Stochastic Block Codes".

ICASSP '84 Proceedings vol. 1, 19 Mar. 1984, San Diego, Calif., pp. 1121–1124, Adoul et al. "Baseband Speech Coding @2400bps Using Spherical Vector Quantization".

ICASSP '89, vol. 1, 23 May 1989, Glasgow, Scotland, pp. 132–135 J. Menez et al., "Adaptive Code Excited Linear Predictive Coder (ACELP)".

Electronic Letters, vol. 23, No. 6, 12 Mar. 1987, Hitchin GB, pp. 253–254, P. G. Hammet, "Complexity Reduction in Fully Vector Quantised Stochastic Coders".

Eurospeech 89, vol. 1, Sep. 1989, Paris, France; pp. 322–325 N. Moreau et al., "Mixed Excitation CELP Coder".

ICASSP '90, vol. 1, Apr. 1990, Albuquerque, New Mex.; pp. 461–464; I. A. Gerson et al. "Vector Sum Excited Linear Prediction (VSELP) Speech Coding at 8kbps".

B. S. Atal, "Stochastic Coding of Speech Signals at Very Low Bit Rates" IEEE/Elsevier Science Publishers B. V., 1984 pp. 1610–1013.

Primary Examiner—Gopal C. Ray
Assistant Examiner—Richard J. Kim
Attorney, Agent, or Firm—Nixon & Vanderhye

[57] ABSTRACT

In a signal encoding device, a voice signal is divided into subsignals each comprising a predetermined number of successive samples, and data trains are generated by giving initial values to a recurrence equation. The generated data trains are divided into patterns each comprising the same number of samples as the predetermined number. The distance between each pattern produced by the pattern dividing unit and each of the subsignals are calculated. The pattern that provides the smallest distance with respect to each of the subsignals is identified, and the initial value set in the recurrence equation for generation of the data train that constitutes the pattern is output as coded data representing the respective subsignal.

9 Claims, 16 Drawing Sheets

SIGNAL ENCODING DEVICE

BACKGROUND OF THE INVENTION

1. Field of the Invention

This invention relates to a signal encoding device for low-bit encoding of voice signals or the like by vector quantization.

2. Description of the Prior Art

Among methods of low-bit encoding voice signals for transmission or recording and high-quality reconstruction of the voice signals, the partial auto-correlation (PARCOR) method which uses feature parameters extracted by linear prediction analysis, and the code excited linear prediction (CELP) method with improved voice quality are known to be excellent. However, these methods require complicated processes for encoding and reconstructing voice signals, and especially in the CELP method, a large-capacity memory is required for a code book used for vector quantization of residual waveforms, thus making the hardware expensive to construct.

Accordingly, in cases where a simple hardware configuration is demanded in preference to the voice reproduction quality, for example, in electronic apparatus for producing simple voice messages or voice guidance, the vector pulse code modulation (VPCM) method has heretofore been used in which the original waveform of a voice signal is vector-quantized using a low-bit code book. In the VPCM method, as shown in FIG. 14, an analog-to-digital converted voice signal is first divided into blocks of N samples (where N is an integer not smaller than 2), and each divided voice signal is sequentially compared with a plurality of patterns using a distance calculating circuit 101. The plurality of patterns are each composed of N samples of data each comprising the same number of bits as that of the quantization bits of the voice signal. A variety of these patterns (e.g., 256 kinds of patterns addressable by eight bits at minimum) are stored in a code book 102 in a memory. The 256 kinds of patterns are selected beforehand, based on the actual voice data to be encoded, using an appropriate method so as to minimize the quantization error. The patterns stored in the code book 102 are read out one by one by a pattern selector 103 and sequentially compared with each divided voice signal. The pattern that provides the smallest deviation (distance) from the voice signal is identified by a minimum value identifying circuit 104, and the address of that pattern in the code book 102 is output as coded data. This means that a voice signal represented by N samples is converted to address data in the code book 102 (i.e. the address of the pattern closest to the voice signal). In the case of 8-bit quantization, for example, data consisting of eight samples of the voice signal (i.e. a total of 64 bits) is compressed to 8-bit address data. Reconstruction from the data encoded by the VPCM method is achieved by sequentially reading out the patterns from the same code book by the addresses of the coded data and converting the data from digital to analog form.

However, the VPCM method has a problem in that the memory capacity required is still too large, if not so large as in the CELP method, to make the hardware simple enough. In the above example, the size of the code book 102 is required to be 16-kilobits (8 bits $\times$ 8 samples $\times$ 256 patterns) to store a plurality of patterns. Furthermore, the optimum patterns stored in the code book 102 are dependent on the actual voice data used in all kinds of apparatus mentioned above. As a result, when the voice data are changed, the patterns must be reselected to match the new voice data. This impairs the versatility of the ROM that constitutes the code book 102, and thus prevents the reduction of costs by mass production.

SUMMARY OF THE INVENTION

The signal encoding device of this invention, which overcomes the above-discussed and numerous other disadvantages and deficiencies of the prior art, comprises: signal dividing means for dividing a signal into subsignals each comprising a predetermined number of successive samples; data train generating means for generating data trains by giving initial values to a recurrence equation; pattern dividing means for dividing the generated data trains into patterns each comprising the same number of samples as said predetermined number; distance calculating means for calculating a distance between each pattern produced by said pattern dividing means and each of said subsignals; and minimum value identifying means for identifying a pattern that provides the smallest distance with respect to each of said subsignals, and for outputting, as coded data representing the respective subsignal, an initial value set in the recurrence equation for generation by said data train generating means of the data train that constitutes said pattern.

Preferably, the gain of each pattern is adjusted so as to reduce the distance between the pattern and the subsignal, and said distance calculating means calculates the distance between the gain-adjusted pattern and the subsignal, and the initial value for the pattern identified by said minimum value identifying means as the one providing the smallest distance and the gain adjustment amount for that pattern are output as coded data.

Alternatively, said distance calculating means calculates the distance between each pattern and each of said subsignals by taking, as an element of the calculation, the largest distance out of distances calculated for the respective samples of the respective subsignal and the pattern.

In preferred embodiments, the number of said divided samples is adjustable in both said signal dividing means and said pattern dividing means such that when the smallest distance identified by said minimum value identifying means is greater than a threshold value, the encoding processing is performed over again on the same subsignal with the number of divided samples reduced in both said signal dividing means and said pattern dividing means, and the initial value for the pattern identified as a result of the reencoding and information on the signal redivision are output as coded data.

In preferred embodiments, said data train generating means comprises a band-adjusting filter having a plurality of frequency characteristics so that a data train generated by the recurrence equation is subjected to a plurality of band-adjusting filter treatments with different frequency characteristics to produce a plurality of data trains, and the initial value for the pattern identified by said minimum value identifying means as the one providing the minimum distance and the information on the frequency characteristics of said band-adjusting filter by which that pattern was treated are output as coded data.

Preferably, in said data train generating means, the period of the recurrence equation for generating data trains is adjustable, and when the smallest distance identified by said minimum value identifying means is greater than the threshold value, the encoding processing is performed over again on the same subsignal by lengthening the period of the recurrence equation in said data train generating means, and the initial value for the pattern identified as a result of the reencoding and the information on the altered period of the recurrence equation are output as coded data.

Preferably, said device comprises: a plurality of processing sections each comprising said signal dividing means, data train generating means, pattern dividing means, distance calculating means, and minimum value identifying means; and one or more residual calculating means for calculating the residual between the pattern based on the coded data output from one of said processing sections and the subsignal for each sample, said residual calculating means being respectively connected between said processing sections, said signal dividing means in another one of said processing sections using the residual calculated by said residual calculating means as a subsignal.

In another aspect of the invention, the signal encoding device of the invention comprises encoding means and coefficient optimization means. The encoding means comprises vector quantization means and sum calculating means. The vector quantization means has: (a) pattern generating means for generating patterns, each comprising a predetermined number of digital data, by sequentially setting initial values and performing a recurring calculation by a recurrence equation with each given initial value; (b) a digital filter for limiting the bandwidth of each pattern generated by said pattern generating means, said digital filter having one or more coefficients which are adjustable; (c) distance calculating means for calculating the distance between the input signal comprising a predetermined number of digital data and each of band-limited patterns output through said digital filter; and (d) identifying means for identifying the minimum value out of distances calculated for respective patterns by said distance calculating means, and for outputting the corresponding initial value of said pattern generating means as coded data for vector quantization. The sum calculating means sums the smallest distances each identified by said identifying means for each of the subsections of the input signal after the implementation of said vector quantization means for each of the predetermined number of input signals. The coefficient optimization means optimizes said coefficients of digital filter for said vector quantization and directs the reimplementation of said encoding means, when the difference between the sum of the smallest distances calculated by said sum calculating means and the previous sum of the smallest distances is greater than a predetermined threshold value.

Thus, the invention described herein makes possible the objectives of:

(1) providing a signal encoding device which can operate with a small-capacity code book;

(2) providing a signal encoding device which can operate with a versatile code book;

(3) providing a signal encoding device which can be manufactured with a reduced cost; and (4) providing a signal encoding device which can encode versatile signals.

In the signal encoding device of the invention, the signal dividing means divides a digital signal representing a voice signal or the like, for example, into subsignals each comprising successive N samples. The digital signal is generated by sampling an analog signal and (scalar) quantizing the samples. Each subsignal comprising N samples can be treated as a vector in an N-dimensional signal vector space.

The data train generating means generates data trains by giving initial values to a recurrence equation, and the pattern dividing means divides the data trains into patterns each comprising N samples as in the signal dividing means. In this case also, each pattern comprising N samples can be treated as a vector in an N-dimensional signal vector space, and this vector is used as a representative vector in vector quantization. The data train which constitutes each pattern usually consists of a plurality of data each comprising the same number of bits as that of the quantization bits of the digital signal. When the digital signal is a voice signal, for example, it is possible to confer the frequency characteristics of voice articulation structures on the data train, the sound source, by passing the signal through a band-adjusting filter.

The recurrence equation (difference equation) is an equation in which function f(i) is defined as a function of f(i-1), ..., f(i-p) (where p is a constant not smaller than 1 and denotes the order of the recurrence equation). This recurrence equation requires p initial conditions, and can generate an infinite number of data trains by sequentially performing calculations with the initial conditions as the initial values. With the same initial value, the generated data trains are always identical. Furthermore, since the generated data have a larger number of bits than the initial value, signal compression is achieved. Each generated data is expressed by a finite number, and therefore the data train invariably has a period, so that the number of patterns obtained by dividing the data trains is also finite. Accordingly, it is desirable to use a recurrence equation that generates a data train having as long a period as possible, in order to generate a large number of patterns. Also, the large number of generated patterns which are used as representative vectors in vector quantization must be distributed in the signal vector space as uniformly as possible.

One of the recurrence equations which satisfies the above-mentioned requirements is a pseudo-random number sequence. For example, the congruential method using a single-order recurrence equation as shown below is a typical method of generating pseudo-random numbers.

$$Z_i = a \cdot Z_{i-1} + b \pmod{m}$$

With the congruential method, however, the period cannot exceed the modulus m (since a single-order recurrence equation is used, m is the maximum number of numbers attainable by an initial value), and lattice-like regularity occurs in a multidimensional space. Therefore, the congruential method is not exactly the best method for the generation of representative vectors. On the other hand, with the maximum-length linearly recurring sequence (M-sequence) using a multiple-order recurrence equation, such as $$Z_i = Z_{i-24} + Z_{i-55} \pmod{m}$$

which is based on a plurality of preceding data, the maximum attainable period is $m^p - 1$ (p=55-order in the above equation). The initial values are given by p terms with m as the modulus, thus attaining a sequence of $m^p$ numbers, and a uniform distribution can be attained even in a multidimensional space. Thus, the M-sequence is most promising as a method for the generation of representative vectors. Moreover, the M-sequence has the advantage that it can be implemented by simple hardware using a shift register. In the generation of pseudo-random numbers, the initial value is called the seed.

In the invention, it is sufficient to provide, by using a recurrence equation, representative vectors which are uniformly distributed in the signal vector space regardless of the sequence of their generation, and therefore, all the properties of random numbers are not necessarily required. Therefore, a recurrence equation which is not very suitable for generation of random numbers or which sequentially generates patterns in a regular manner may be acceptable.

In the data train generating means, an initial value may be given each time a predetermined number of data trains are generated. Alternatively, the initial value may be given first, and the data trains generated within each subsequent period may be divided by the pattern dividing means to obtain a predetermined number of patterns. In this case, the first data in the data train that constitutes each pattern is the initial value for the pattern. In the data train generating means, the above-described recurrence equation may be implemented either in software or in hardware.

Each time the signal dividing means divides a signal into subsignals each comprising N samples, the predetermined number of patterns are generated by the data train generating means and pattern dividing means, and each time the signal is thus divided, the distance calculating means calculates the distance between each subsignal and each of the predetermined number of patterns. A suitable distance (e.g., the Euclidean distance (sum of squared differences) in an N-dimensional space) can be adopted as the distance between a subsignal and a pattern, but the method of calculating the distance is not limited to the above, and it is possible to select an appropriate method depending upon the nature of the signal.

When the distance calculating means has completed the calculation of distances of all patterns for each subsignal, the minimum value identifying means identifies the smallest distance out of the thus calculated distances and outputs the initial value for the data train for generating that pattern as the coded data of the subsignal. This means that N data each having the same number of bits as the quantization bits of the original digital signal are compressed and encoded into data having the same number of bits as that of the initial value of the recurrence equation.

Thus, according to the invention, there is no need to provide a large-capacity code book containing a large number of preselected patterns, and hence the hardware can be made further simple in construction. Since the number of patterns can be increased easily by selecting a suitable recurrence equation and without straining the hardware, not only the quantization error decreases but also encoding of versatile signals can be realized. For example, when encoding a 16-bit digital signal by dividing it into blocks of eight samples, if a 23-bit scrambler that generates an M-sequence of pseudo-random numbers is used as the data train generating means, the period of the data train will be approximately equal to $2^{23}$. Therefore, the number of patterns that can be generated will be approximately one million which is given by dividing by eight samples. In this case, the original signal block comprising a total of 128 bits (16 bits$\times$8 samples) is compressed to data of 23 bits, the same number of bits as that of the seed given to the scrambler. If these one million patterns are to be stored in a memory to construct a code book as in the prior art, it would require a memory size of about 100 megabits (total number of patterns$\times$16 bits$\times$8 samples). Therefore, when the above-mentioned 23-bit scrambler comprising a shift register and a logic circuit is used instead of the code book, the hardware can be implemented in a simple construction.

In an embodiment in which the gain of each pattern is adjusted in such a manner as to reduce the distance between the pattern and the subsignal prior to the calculation of the distance by the distance calculating means, if there is any pattern which is quite similar in waveform to but different only in level from the signal in a plurality of patterns, the initial value for this pattern can be adopted as coded data, which serves to achieve a further reduction in quantization error. This is essentially the same as increasing the number of patterns, and since the gain adjustment information is added to the coded data, the data compression ratio decreases accordingly.

In an embodiment, when the distance calculating means calculates the distance between the subsignal and each pattern, the largest distance out of the distances for the respective samples of the subsignal and each pattern is taken as an element of calculation. When a pattern provides the smallest Euclidean distance in N-dimensional space, if the one-dimensional distance between a sample thereof and the subsignal is extremely large, the waveform of the pattern may greatly differ at this portion from the subsignal, and serious degradation of voice quality is caused in the case of a voice signal. However, according to the invention, a pattern with a closer waveform can be selected even though it does not provide the smallest Euclidean distance in the N-dimensional space. This contributes to enhancing the voice quality, etc.

In an embodiment in which, when the smallest distance identified by the minimum value identifying means is greater than the threshold value, encoding is performed over again on the same subsignal with the number of samples reduced in the signal dividing means and the pattern dividing means, reducing the number of samples increases the probability of further reducing the smallest distance between the subsignal and the pattern, and hence a decrease in quantization error. However, when the number of samples is reduced, the compression ratio of the coded data decreases, and the compression ratio is further decreased by the addition of the information on the signal redivision.

According to the configuration in which a data train for a pattern produced by a recurrence equation of the data train generating means is passed through band-adjusting filters with different frequency characteristics to produce a plurality of patterns, the increase in the number of patterns contributes to a decrease in quantization error although the data compression ratio decreases because of the addition of the information on the band-adjusting filter selection. In the encoding of a voice signal, for example, since the use of more than one band-adjusting filter allows the conferment of the frequency characteristics representing a plurality of representative voice articulation structures, improvement in the voice quality can be expected that can more than offset the decrease of the compression ratio.

In an embodiment, when the smallest distance identified by the minimum value identifying means is greater than the threshold value, the period of the recurrence equation in the data train generating means is lengthened to generate data trains, and encoding is performed over again on the same subsignal. The longer period of the recurrence equation causes an increased number of kinds of generated patterns, and therefore, the probability of further reducing the smallest distance between the subsignal and the pattern increases, contributing to a reduction in quantization error. However, the maximum period of the recurrence equation is limited by the number of numbers (terms) attainable by the initial value. Therefore, a longer period means an increase in the bit count of the initial value, and a decrease in the coded data compression ratio. Furthermore, since the information on the altered period of the recurrence equation needs to be added, the compression ratio further decreases.

In an embodiment, when the first coded data of a subsignal is output from the minimum value identifying means in the first processing section, the residual calculating means calculates the residual between the subsignal and the pattern produced based on this coded data, and the residual signal is used as the subsignal by the signal dividing means in the second processing section. The coded data of the residual signal is output from the minimum value identifying means in the second processing section, and the same processing is repeated a number of times equivalent to the number of processing sections provided, to output coded data sequentially. The coded data of more than one residual signal added to the coded data of the original signal serve to further reduce the quantization error. However, outputting more than one coded data for one subsignal results in a decrease in the compression ratio of the coded data. The residual calculating means can be easily implemented by obtaining the intermediate output of the distance calculating means in each section, without reconstructing the output coded data into a pattern.

In the alternative signal encoding device according to the invention, the input signal is processed as a digital signal by the vector quantization means. When the original signal is an analog signal, the digital signal is produced by sampling the analog signal and (scalar) quantizing the samples. In vector quantization, processing is performed by dividing the digital signal into input signals each comprising a predetermined number of digital data (N samples). Each input signal comprising N samples can be treated as a vector in an N-dimensional signal vector space.

In the vector quantisation means, first the pattern generating means generates patterns each comprising digital data of N samples by setting an initial value in a recurrence equation as previously mentioned and performing a recurring calculation by the recurrence equation. By setting different initial values sequentially, a large number of patterns are generated in sequence. Each pattern comprising N samples can be treated as a vector in an N-dimensional signal vector space, as in the case of the input signal, and becomes a representative vector in vector quantization.

As in the data train generating means, in the pattern generating means, a different initial value may be given each time digital data of N samples is generated. Alternatively, the initial value may be given first, and all the digital data generated within each subsequent period may be divided into blocks of N samples to obtain a plurality of patterns. In this case, the first digital data in each pattern is the initial value for the pattern. In the pattern generating means, the recurrence equation may be implemented either in software or in hardware.

Each pattern generated by the pattern generating means is passed through the digital filter where its bandwidth is limited, and is then transferred to the distance calculating means. The distance calculating means calculates the distance between each input signal of N samples and each pattern of N samples. As the distance between each input signal of N samples and each pattern of N samples, the Euclidean distance (sum of squared differences) in an N-dimensional space may be adopted, for example, but the method of expression is not limited to this, and a suitable method may be selected according to the nature of the signal.

When the distance calculating means has completed the calculation of distances of all patterns for each block (N samples) of input signals, the identifying means identifies the smallest distance out of the thus calculated distances and outputs the initial value of the pattern generating means for that pattern as the coded data by vector quantization. This means that N data each having the same number of bits as the quantization bits of the original digital signal are compressed and encoded into data having the same number of bits as that of the initial value of the recurrence equation.

The encoding means performs the vector quantization of the input signals, as described above, by implementing the vector quantization means. The sum calculating means calculates the sum of the smallest distances each identified by the identifying means for each block (N samples) of input signals.

Next, the digital filter coefficients are optimized based on the sum of the smallest distances calculated by the sum calculating means, and processing by the block encoding means is performed once again. The optimization of the digital filter coefficients is performed by an appropriate algorithm that renders the digital filter characteristics more suitable to the input signal.

In implementation of the encoding means, the sum calculating means recalculates the sum of the smallest distances. The coefficient optimization means calculates the difference between the sum of the smallest distances and the previous sum of the smallest distances and compares this difference with the threshold value. If the difference is greater than the threshold value, the optimization of the digital filter coefficients is performed, and reencoding by the encoding means is directed. When the difference is reduced to within the threshold value as a result of repeated implementation by the block reencoding means, the vector quantization of the predetermined number of input signals is complete, and each of the last output initial values from the identifying means of the vector quantization means is determined as the coded data. The digital filter coefficients are also output as part of the coded data.

Thus, in accordance with the alternative signal encoding device of the present invention, since there is no need to provide a large-capacity code book containing a large number of predetermined patterns, the hardware can be further simplified in construction. Since the number of patterns can be increased easily by selecting a suitable recurrence equation and without straining the hardware, not only the quantization error decreases but also encoding of versatile signals can be realized. Furthermore, since the characteristics of the digital filter that limits the bandwidth of the pattern produced by the recurrence equation are automatically optimized, encoding of further enhanced quality can be achieved just by adding coefficient data for the prescribed number of input signals and without impairing the versatility of the hardware.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The preferred embodiments of the present invention will now be described with reference to the accompanying drawings.

Figure 1:
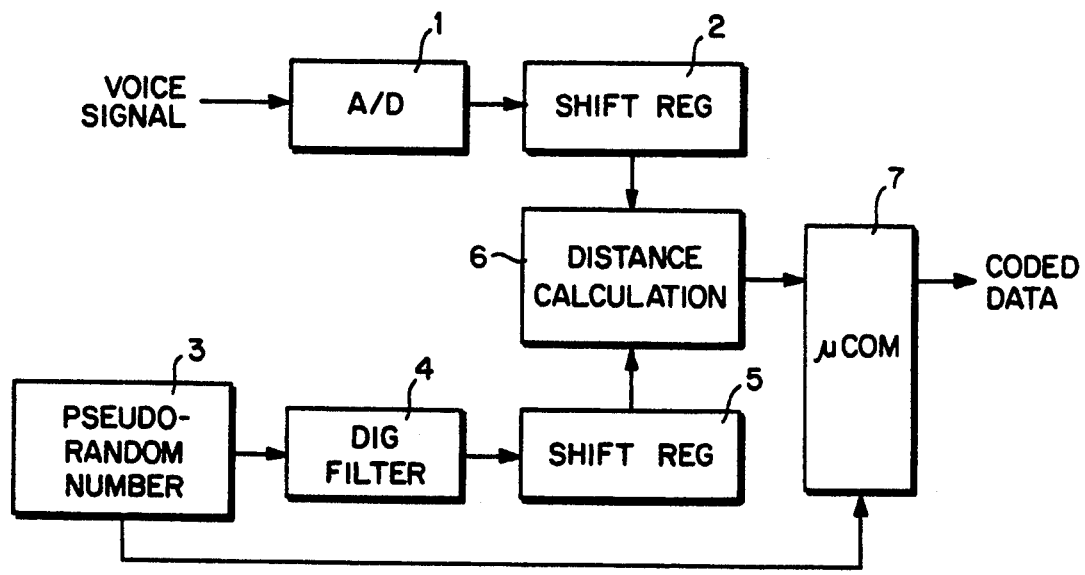
FIG. 1 is a block diagram illustrating an embodiment of the invention.

FIG. 1 illustrates one embodiment of the invention. As shown, in the voice signal encoding device of this embodiment, the input voice signal is converted to a digital signal by an A/D converter 1 and the digital signal is transmitted to a voice shift register 2. The A/D converter 1 samples the voice signal at a rate of 8,000 Hz for 16-bit (scalar) quantization. The voice shift register 2 is a 16-bit 32-stage shift register. The digital signal output from the A/D converter 1 is supplied in blocks of 16 bits to the voice shift register 2 which performs shifts until 32 samples of the voice signal are stored therein. In practice, in the case of realtime processing as well as of batch processing, it will be more convenient to temporarily store the digital signal output from the A/D converter 1 into a buffer and read the data as required in blocks of 32 samples from the buffer into the voice shift register 2.

Figure 2:
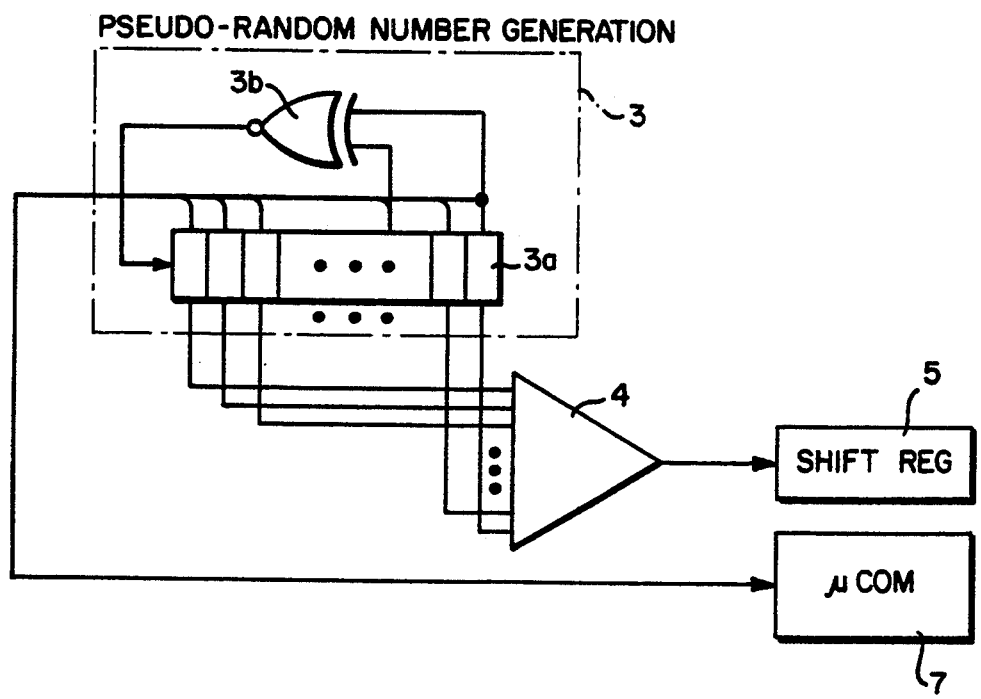
FIG. 2 is a block diagram illustrating a pseudo-random number generator used in the embodiment of FIG. 1.

A data train generated by a pseudo-random number generator 3 is sequentially fed to a pattern shift register 5 through a digital filter 4. As shown in FIG. 2, the pseudo-random number generator 3 is a 23-bit scrambler consisting of a 1-bit 23-stage shift register 3a and an exclusive OR (XOR) circuit 3b. As each bit is shifted upward by one stage, the bit in the most significant stage (the bit entered p shifts before) and a bit in a lower significant stage (the bit entered q shifts before) of the shift register 3a are XORed, and the result is inverted and input to the least significant stage, thus this operation realizes an M-sequence of pseudo-random numbers by the following recurrence equation.

$$Z_i = not(Z_{i-q}(+)Z_{i-p})$$

where Z is 0 or 1, and (+) is the XOR.

In the pseudo-random number generator 3, the maximum period of the bit train to be output is limited by the number of stages (p) of the shift register 3a. In this embodiment, since p is 23, the maximum period is equal to $2^{23} - 1$ (the initial value in which all bits of the shift register 3a are 1 is not usable). Also, q is selected to represent a stage number smaller than p so as to prevent the generation of periods shorter than the maximum period. As a result, when the shift register 3a is caused to perform shifts $2^{23} - 1$ times (hereinafter simply expressed "$2^{23}$"), $2^{23}$ varieties of different 23-bit data are output.

The 23-bit data which is output in parallel from the shift register 3a of the pseudo-random number generator 3 is fed to the digital filter 4 where its bandwidth is limited, and is then fed as a 16-bit parallel signal to the pattern shift register 5 of the same 16-bit 32-stage configuration as the voice shift register 2. While 32 samples of the voice signal are stored in the voice shift register 2, the pseudo-random number generator 3 performs $2^{23}$ shifts to send out $2^{23}$ varieties of 23-bit data to the digital filter 4. The 16-bit data thus sequentially output from the digital filter 4 are grouped in blocks of 32, each block representing one pattern, and a total of approximately 260,000 patterns ($2^{23}$ divided by 32 samples) are sequentially entered into the pattern shift register 5. When the pseudo-random number generator 3 has completed the shift operation, the next 32 samples of the voice signal are loaded into the voice shift register 2, and the pseudo-random number generator 3 is caused to perform the next cycle of shift operation. At the start of the shift operation of the pseudo-random number generator 3, the initial state is set by clearing all bits of the shift register 3a to 0, for example, Also, every time the operation on 32 sample voice signals is completed, the 23-bit data in the shift register 3a at that time is transferred as the seed for a pseudo-random sequence to a microcomputer 7 described below.

Figure 3:
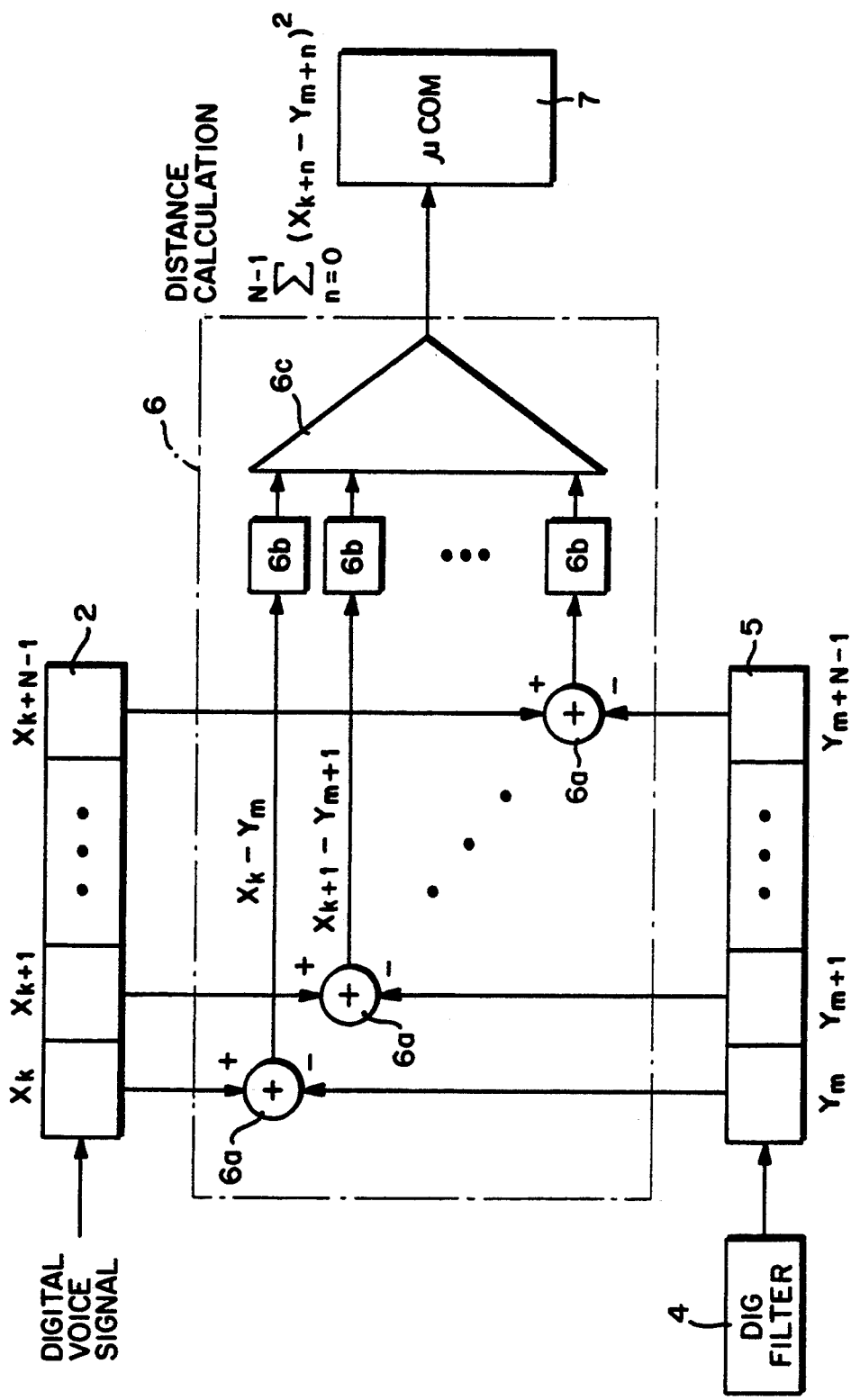
FIG. 3 is a block diagram illustrating a distance calculating circuit used in the embodiment of FIG. 1.

When thirty-two 16-bit data have been shifted into the pattern shift register 5 to form one pattern, a distance calculating circuit 6 (seen in more detail in FIG. 3) calculates the distance between this pattern and the 32 samples of voice signal stored in the voice shift register 2. This distance is a 32-dimensional Euclidean distance obtained by calculating the differences between the samples of the voice signal and the corresponding 16-bit data of the pattern by respective adders 6a, squaring the respective differences by multipliers 6b, and then summing the squared results by an adder 6c. When the pattern stored in the pattern shift register 5 is replaced by the next set of thirty-two 16-bit data, the distance between the new pattern and the voice signal is calculated, and the same processing is repeated for the subsequent sets of data. Therefore, every time a set of 32 samples of the voice signal is stored in the voice shift register 2, the distance calculating circuit 6 performs distance calculations as many times as the number of patterns (about 260,000 times), and the distance data is transmitted to the microcomputer 7.

The thus calculated distances between the 32 samples of voice signal and the respective patterns are sequentially input to the microcomputer 7 which in turn determines the smallest distance out of the distances thus input. As a result of this process, the 23-bit data supplied from the pseudo-random number generator 3 in generating the pattern that provided the smallest distance is output as the coded data representing the 32 samples of voice signal. This 23-bit data serves as the seed for the pseudo-random number generator 3. By entering this data in the corresponding bits of the shift register $3a$ and causing the shift register $3a$ to perform 32 shifts, the pattern that provides the smallest distance with respect to the voice signal can be reconstructed. The microcomputer 7 performs the same processing on the next set of 32 samples of the voice signal to output coded data, and the same processing is repeated for the subsequent sets of samples. As a result, the voice signal represented by 32 samples each comprising 16 bits is compressed and encoded into 23-bit data. This also means that the voice signal of 128 kbps (16 bits $\times$ 8,000 Hz) is compressed to a signal of 5.8 kbps 23 bits $\times$ 8,000 Hz/32 samples). The thus output coded data are stored in a ROM or transmitted directly.

According to this embodiment, a large number of patterns (representative vectors) amounting to about 260,000 varieties can be generated using the simple pseudo-random number generator 3 comprising the shift register $3a$ and the XOR circuit $3b$. Hence, there is no need to provide a code book constructed from a large-capacity memory, and also, encoding of versatile voice signals is realized with improved voice quality.

Figure 4:
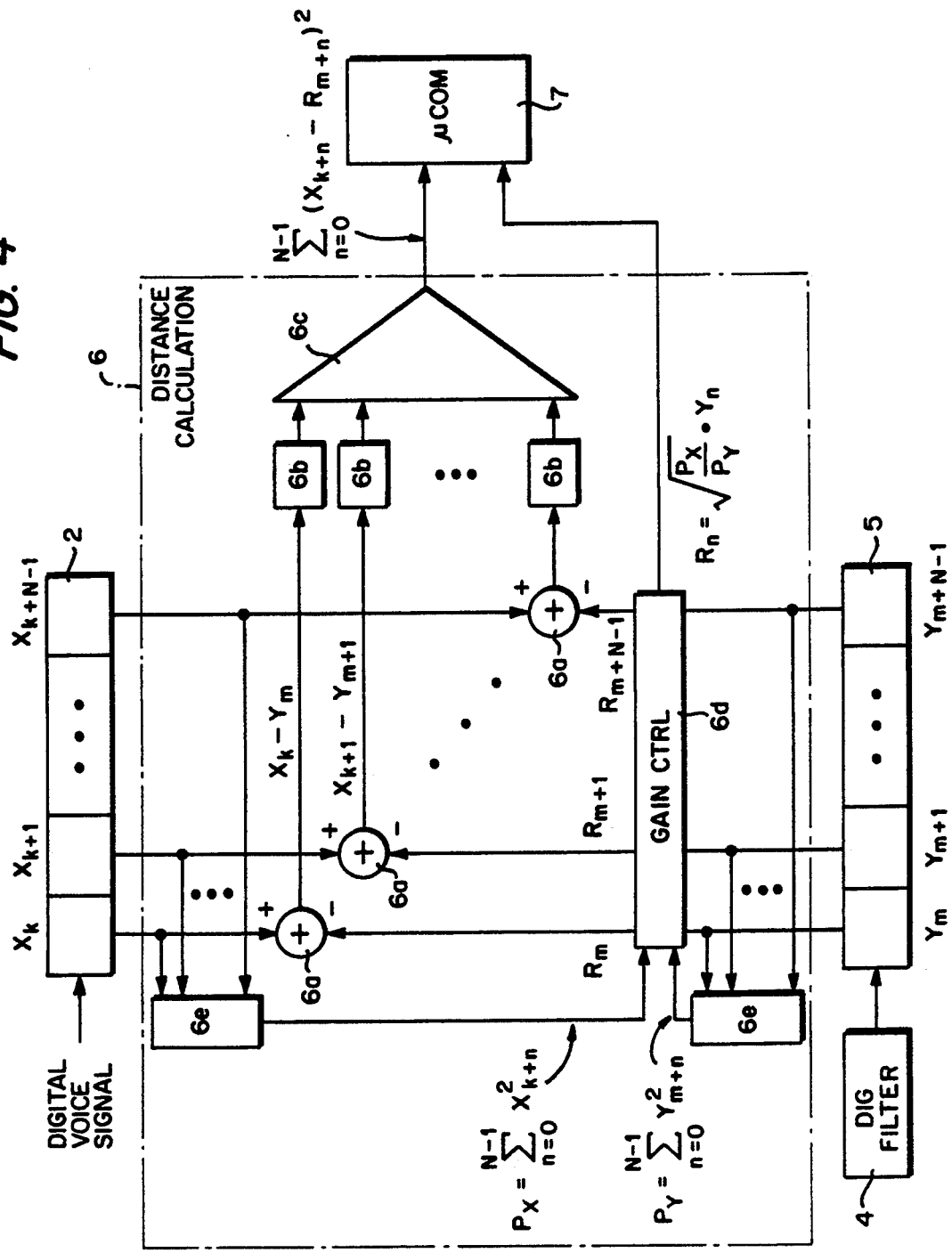
FIG. 4 is a block diagram illustrating a distance calculating circuit used in another embodiment of the invention.

An alternative example of the distance calculating circuit 6 is illustrated in FIG. 4. In the distance calculating circuit 6 of this example, there is provided a gain controller $6d$ by which the gain of the pattern stored in the pattern shift register 5 is adjusted. The adders $6a$ calculate the difference between the gain-adjusted pattern and the voice signal. The distance calculating circuit 6 is also provided with two power calculators $6e$ which respectively perform arithmetic operations on the voice signal stored in the voice shift register 2 or the pattern stored in the pattern shift register 5, i.e., the 16-bit data for each sample is squared and the sum of the results is obtained. The gain controller $6d$ determines the gain control amount by the square root of the output ratio between the power calculators $6e$. Therefore, if there is any pattern in which waveform is very close to that of the voice signal but only the level is different, it may be possible to obtain a smaller distance than in the foregoing example by calculating the distance after adjusting the gain of the pattern by the gain controller $6d$. By adopting the seed for such a pattern as coded data, it is possible to reduce the quantization error and further enhance the voice quality. Since the information of the gain adjustment is also needed for the reproduction of the voice signal, the gain adjustment amount for the pattern is sent from the gain controller $6d$ to the microcomputer 7 and is included in the coded data to be output.

Figure 5:
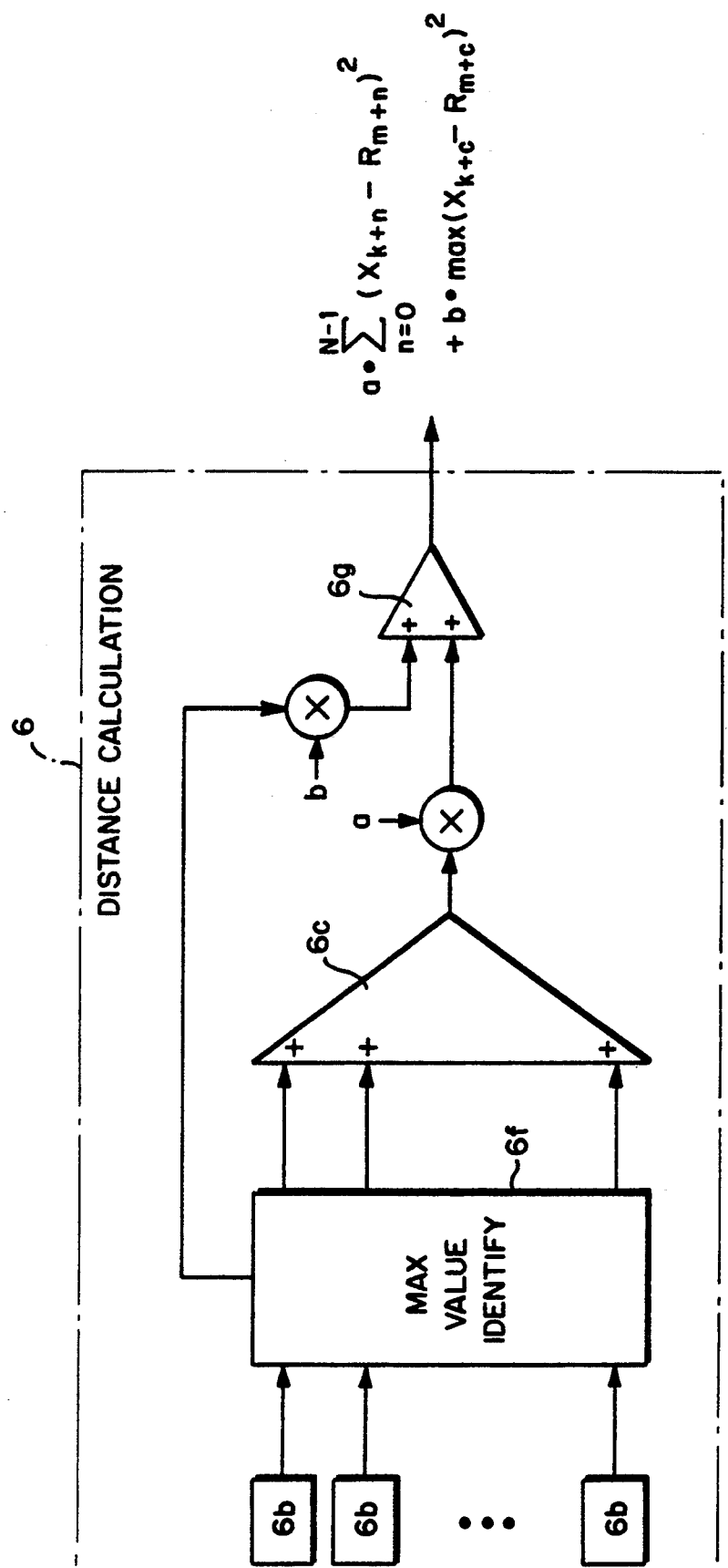
FIG. 5 is a block diagram illustrating one portion of the distance calculating circuit of FIG. 4.

A further alternative example of the distance calculating circuit 6 is illustrated in FIG. 5. In the distance calculating circuit 6 of this example, an adder $6c$ calculates the sum of the calculation results for the respective samples, and a maximum value identifying circuit $6f$ identifies the maximum value out of the calculation results for these samples. Then, the output of the adder $6c$ is multiplied by a constant a, and the maximum value identified by the maximum value identifying circuit $6f$ is multiplied by a constant b. The respective results are then added by means of an adder $6g$, and the result of this addition is output as the distance. Even in the case of a pattern for which the adder $6c$ outputs the smallest output value (32-dimensional Euclidean distance), if the one-dimensional distance at a certain sample is extremely large, the waveform of the pattern greatly differs at this portion from the voice signal, resulting in serious degradation in the resulting voice quality. However, according to this embodiment, even if the output value of the adder $6c$ is not the smallest, a pattern for which the adder $6g$ outputs the smallest value and whose waveform is closer to the voice signal can be identified as the pattern that provides the smallest distance. This serves to further enhance the voice quality.

Figure 6:
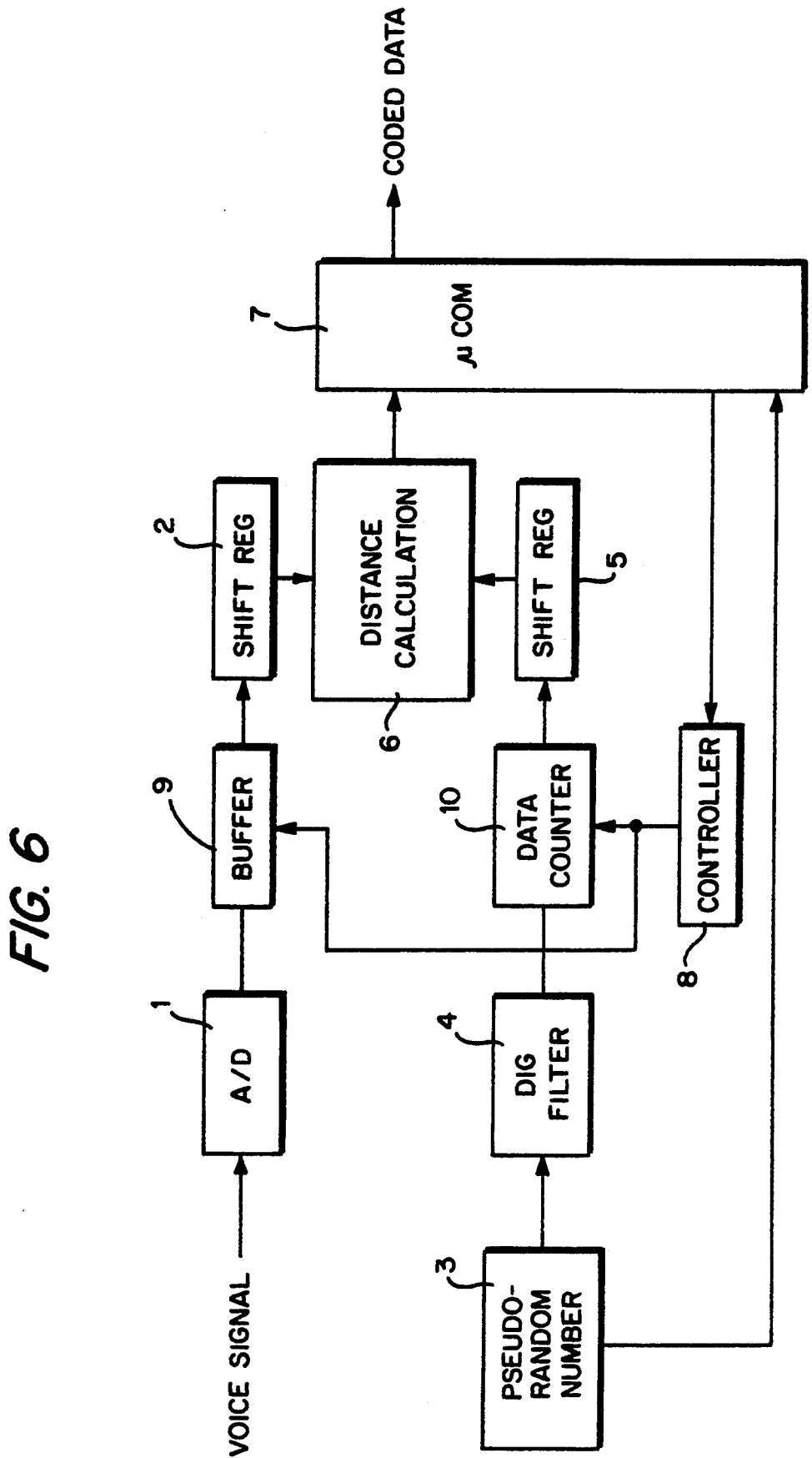
FIGS. 6 to 9 illustrate other embodiments of the invention.

FIG. 6 illustrates a further embodiment of the present invention. In this embodiment, the microcomputer 7 performs additional processing: when the smallest distance calculated by the distance calculating circuit 6 is determined, the microcomputer 7 compares this smallest distance with the threshold value, and issues a signal to a controller 8 if it is determined as a result of the comparison that the smallest distance is greater than the threshold value. Furthermore, in this embodiment, the voice signal is temporarily stored in a buffer 9 before being transferred to the voice shift register 2, and the data train output from the digital filter 4 is also temporarily stored in a data counter 10 before being transferred to the pattern shift register 5. When receiving the signal from the microcomputer 7, the controller 8 controls the buffer 9 and the data counter 10 so that the same data as the data previously sent out are now divided into blocks of N/2 samples and transferred to the voice shift register 2 and the pattern shift register 5, respectively. At this time, the microcomputer 7 makes the encoding of the previous voice signal invalid, and instead performs the encoding of the 32 samples of voice signal in two separate steps and outputs the information of the reduced sample count and the seed for the pattern that provides the smallest distance, both included in the output coded data. Reducing the sample count increases the probability of further reducing the distance between the voice signal and the pattern. Thus, when the pattern that provides a sufficiently small distance cannot be found, the encoding is retried with a reduced sample count, thus ensuring improved voice quality. However, reducing the sample count decreases the compression ratio of the coded data, the compression ratio being further decreased by the addition of the information regarding the reduced sample count.

Figure 7:
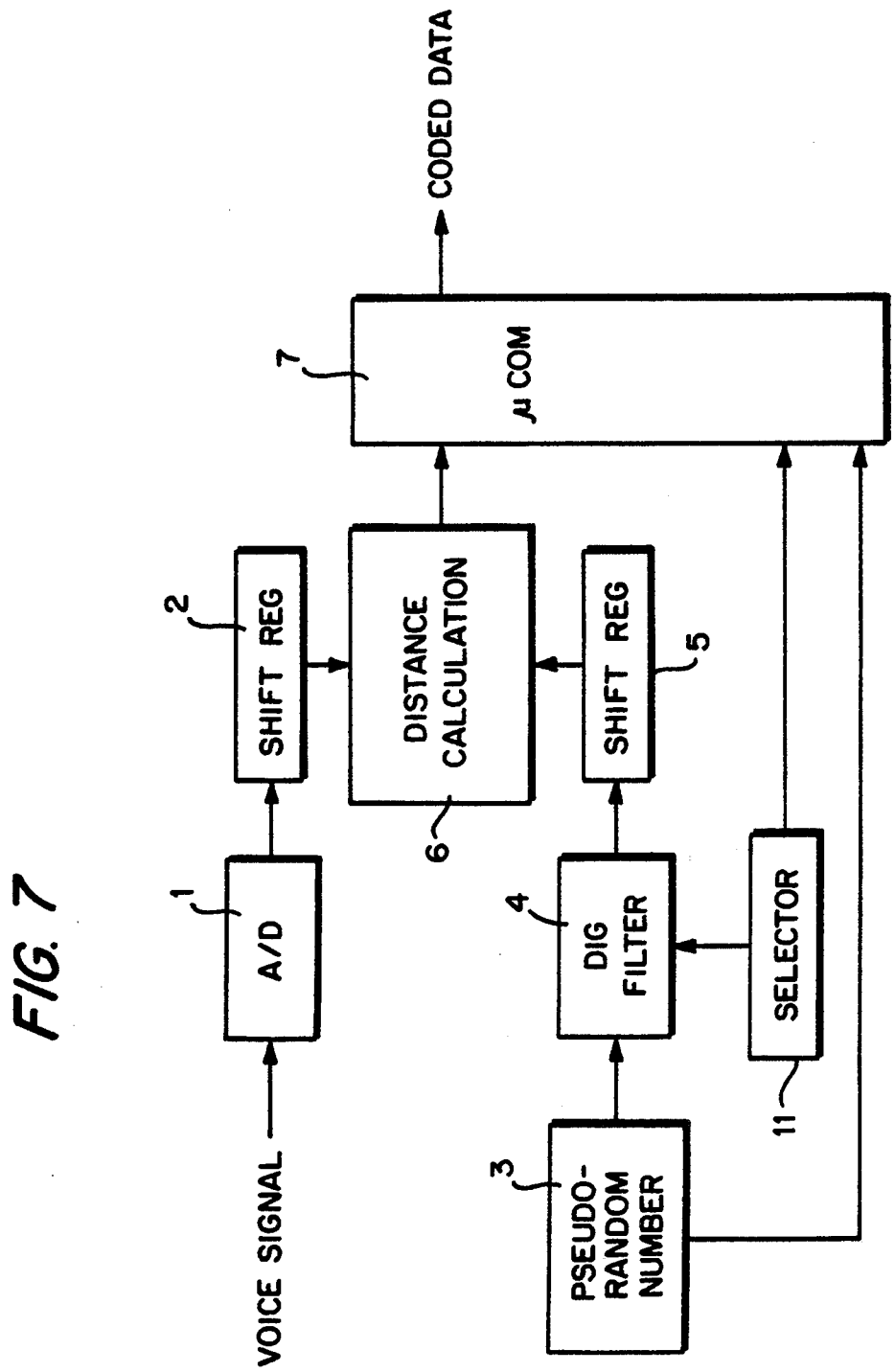

FIG. 7 illustrates still another embodiment of the present invention. In this embodiment, the digital filter 4 is so configured as to provide a plurality of frequency characteristics. This configuration of the digital filter 4 may be implemented either by providing a plurality of filters or by providing a single filter with a plurality of coefficients, but the net effect is essentially the same in either case. The digital filter 4 is connected to a selector circuit 11 which switches the digital filter 4 between the plurality of frequency characteristics. As the pseudo-random number generator 3 generates a data train for one pattern, the data train is temporarily stored in a buffer or the like, and is then fed to the digital filter 4 every time the characteristics thereof are switched over by the selector circuit 11, thereby producing a plurality of data trains. The digital filter 4 is used to confer the frequency characteristics of voice articulation structures on the output of the pseudo-random number generator 3, the sound source. However, if the frequency characteristics of the digital filter 4 are fixed, since the characteristics are determined so as to match the long spectrum of the voice susceptible to the effects of vowels, serious degradation occurs in the case of voice signals containing many high frequency components such as voiceless consonants. On the other hand, if the digital filter 4 is so configured as to confer the frequency characteristics of typical voice articulation structures of different kinds, as in this embodiment, the filter having characteristics closer to the spectral envelope of the original voice can be used, so that the voice quality can be further enhanced. The information of the filter selected by the selector circuit 11 is transferred to the microcomputer 7 and added to the coded data. Also, it may be so configured that the spectral envelope of the original voice is obtained by linear predication analysis or another technique to preselect the filter having the closest characteristics to the spectral envelope and that only the data train passed through this filter is compared with the voice signal.

Figure 8:
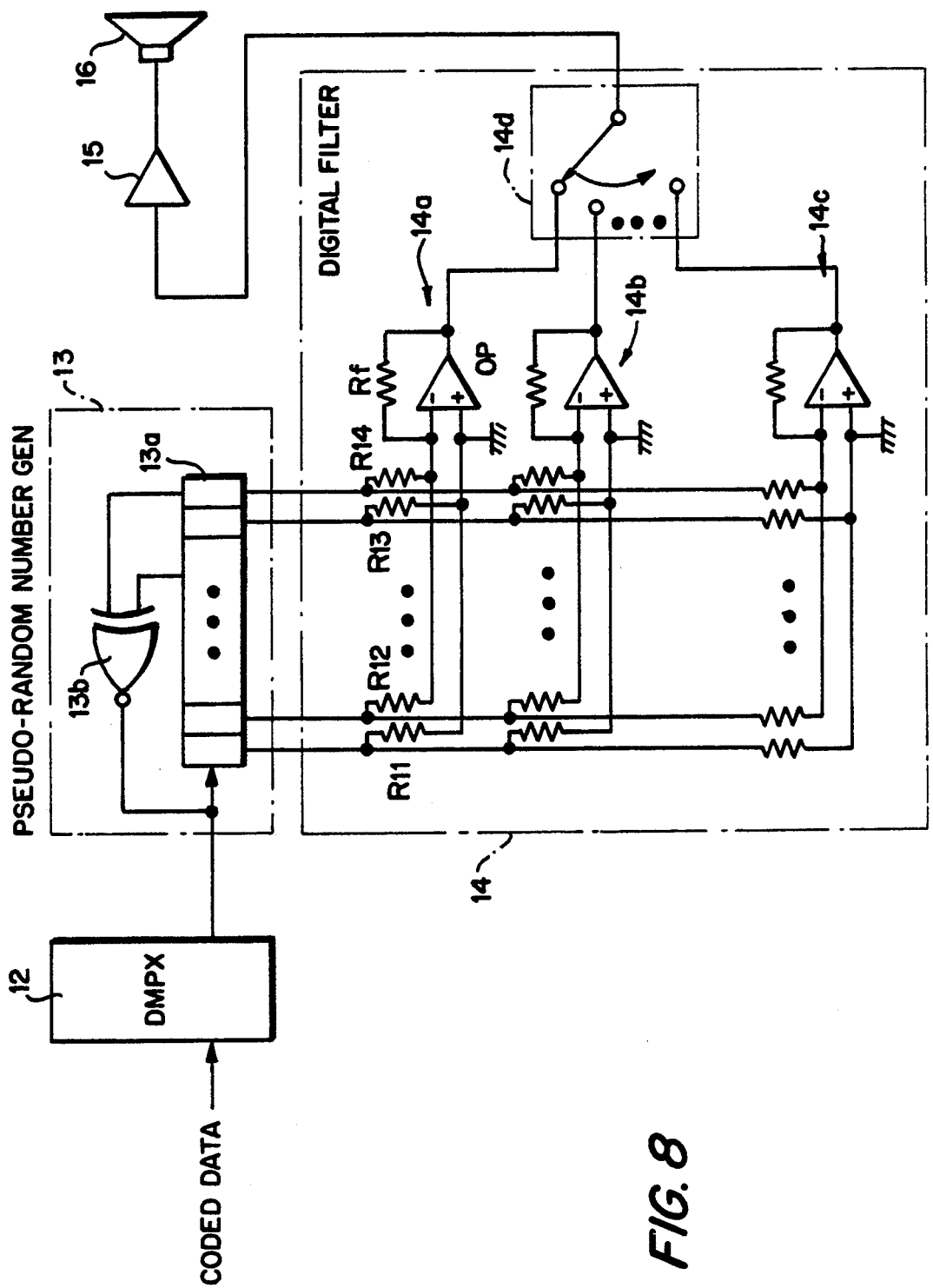

FIG. 8 illustrates a voice reproducing device for reproducing the coded data in accordance with this embodiment. Coded data stored in a ROM or received from the outside of the device is first fed to a demultiplexer 12 where the data is divided into the seed data for the pattern and the filter selection data. The seed data is loaded into the corresponding bits of a shift register 13a of a pseudo-random number generator 13. The pseudo-random number generator 13 is a 23-bit scrambler, as is the aforementioned pseudo-random number generator 3, comprising a shift register 13a and an XOR circuit 13b. With the seed thus given, the shift register 13a performs 32 shifts to output thirty-two 23-bit data from the bit outputs from the shift register 13a to produce a pattern. The pattern output from the pseudo-random number generator 13 is then fed to a synthetic filter 14. The synthetic filter 14 is a filter having two or more different frequency characteristics, as does the aforementioned digital filter 4. In this embodiment, the synthetic filter 14 comprises a plurality of filters 14a, . . . , 14c to each of which the pattern from the pseudo-random number generator 13 is input. These filters 14a, . . . , 14c are FIR filters (finite impulse response filters) each comprising a resistor R and an operational amplifier OP and provided with a different filter coefficient by the ratio of the feedback resistance Rf of the operational amplifier OP and the resistance Ri on the input line. One of the filters 14a, . . . , 14c is selected by a multiplexer 14d for output.

The filter selection data supplied from the demultiplexer 12 is given to the multiplexer 14d of the synthetic filter 14. Based on this data, one of the filters 14a, . . . , 14c is selected for output. Therefore, the patterns can be output through the filters 14a, . . . , 14c having the same characteristics as those of the aforementioned digital filter 4 used for encoding by the voice signal encoding device of this embodiment. Each pattern thus output is amplified by an amplifier 15 and reproduced as a voice of high quality through a loudspeaker 16. Since the synthetic filter 14 outputs an analog signal by D/A conversion, there is no need to provide a discrete D/A converter.

Figure 9:
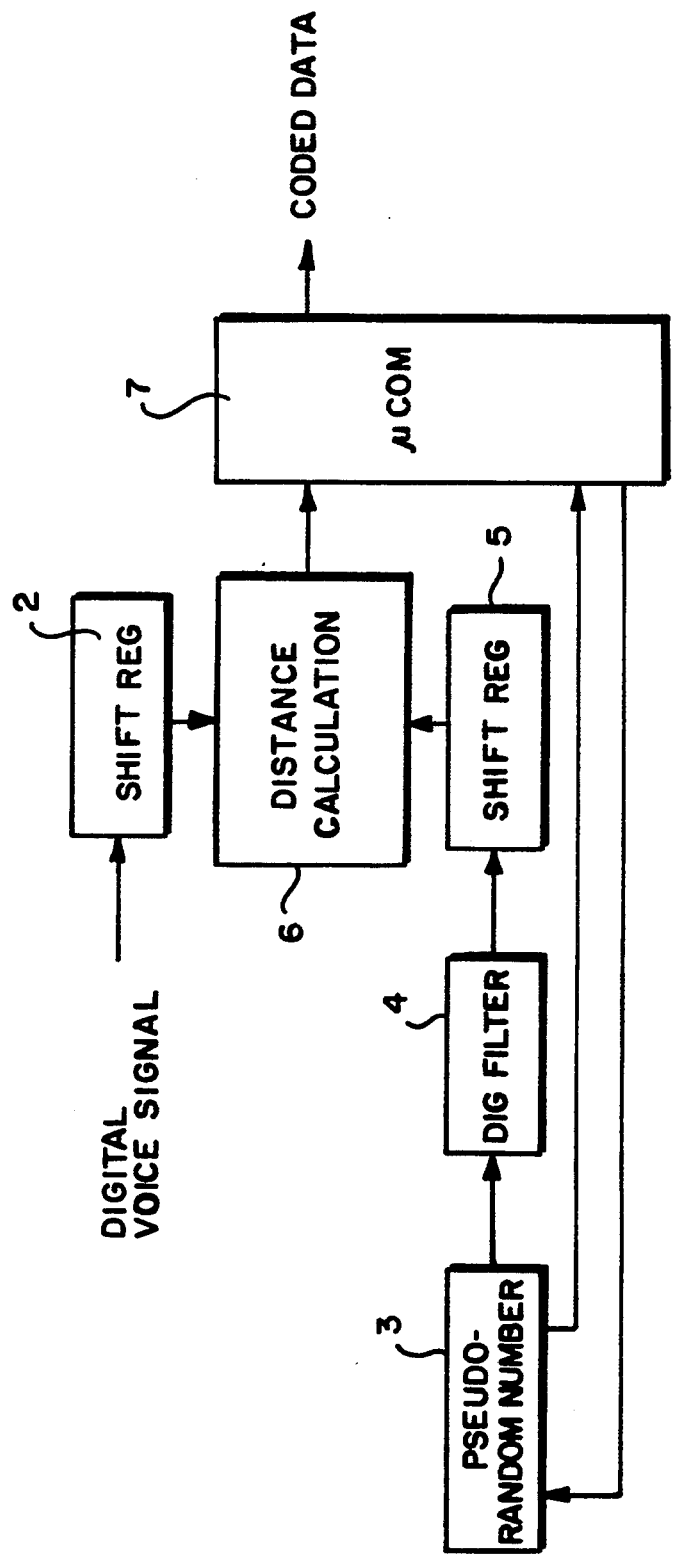
Figure 10:
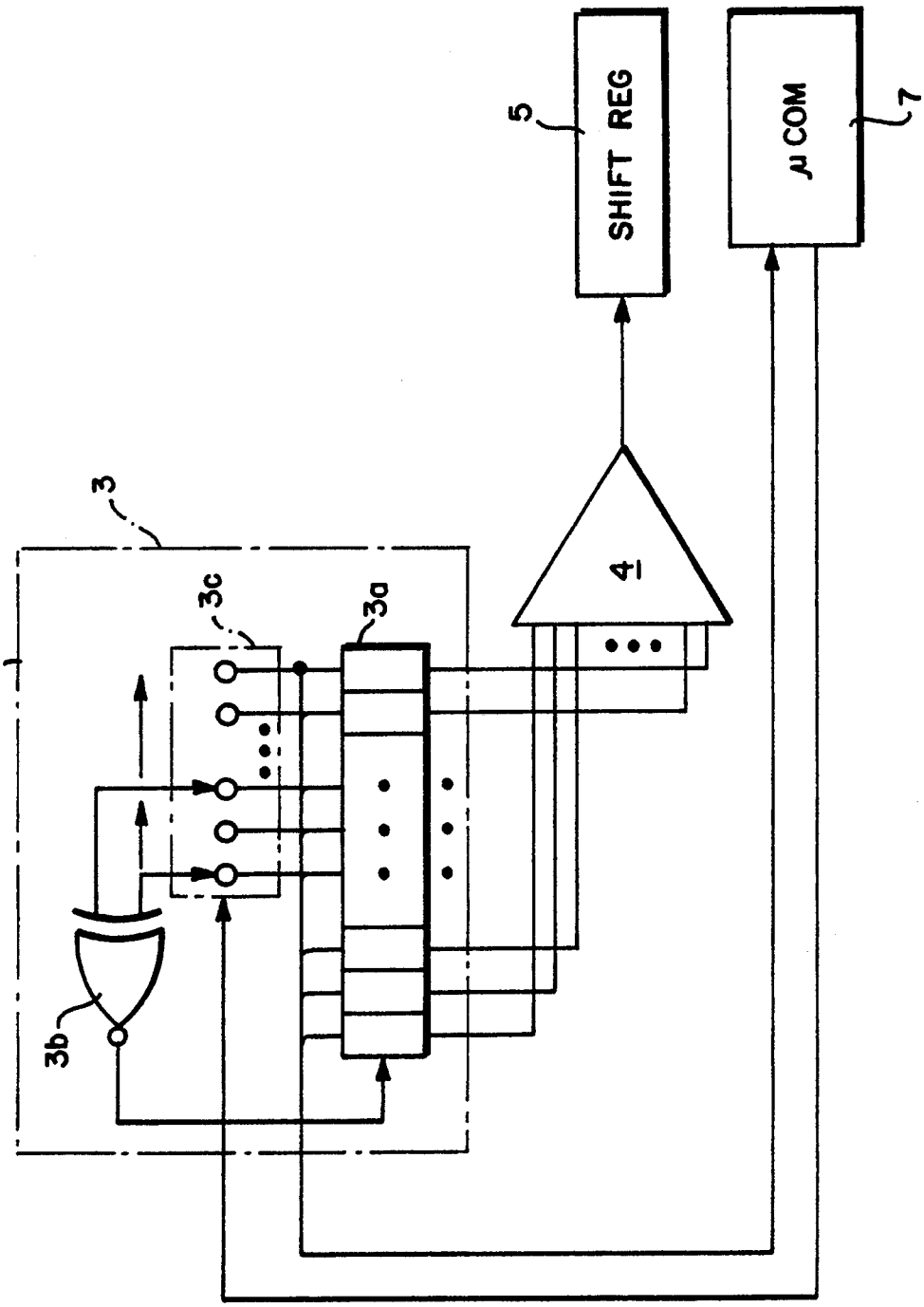
FIG. 10 is a block diagram illustrating a pseudo-random number generator used in the embodiment of FIG. 9.
Figure 11:
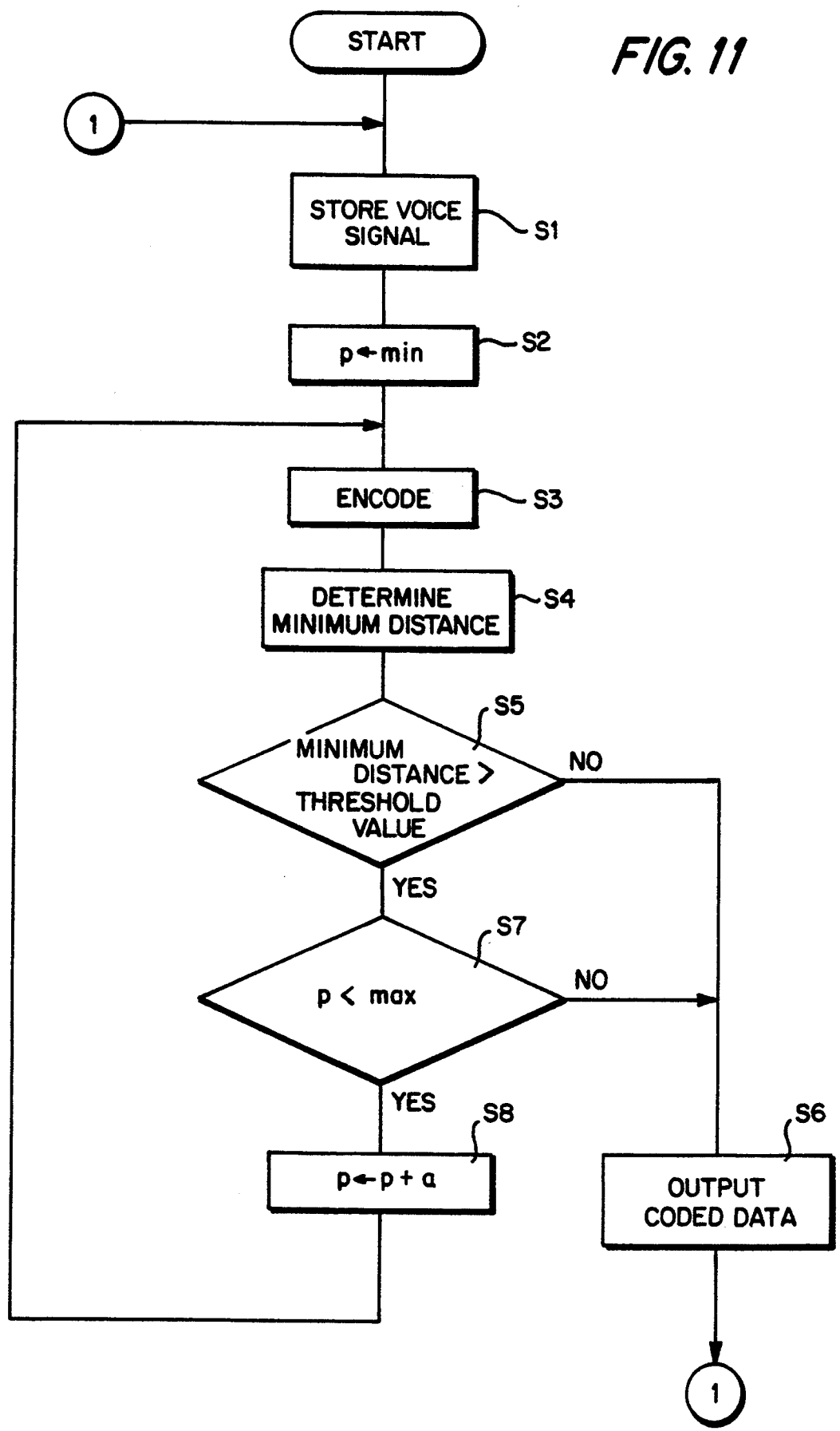
FIG. 11 is a flow chart illustrating the operation of the embodiment of FIG. 9.

A further embodiment of the present invention is illustrated in FIGS. 9 to 11. In this embodiment, the microcomputer 7 performs additional processing: when the smallest distance calculated by the distance calculating circuit 6 is determined, the microcomputer 7 compares this smallest distance with the threshold value, and issues a signal to the pseudo-random number generator 3 if it is determined as a result of the comparison that the smallest distance is greater than the threshold value. As shown in FIG. 10, the pseudo-random number generator 3 is provided with a selector circuit 3c which selects the stage of the shift register 3a to input to the XOR circuit 3b. The signal from the microcomputer 7 is supplied to the selector circuit 3c. When the signal from the microcomputer 7 is given, the selector circuit 3c of the pseudo-random number generator 3 moves the stage for input to the XOR circuit 3b to the next higher significant position. The pseudo-random number generator 3 is so configured as to generate an M-sequence of pseudo-random numbers, as previously mentioned. When the stage for input to the XOR circuit 3b is moved to the next higher significant position, therefore, the order p of the recurrence equation increases, and the maximum period (the pth power of 2) of the data grain generated becomes longer. However, an increase in the order p also increases the bit count (p bits) of the seed. At this time, the other input (q) of the XOR circuit 3b is moved to the bit position so selected as to realize the maximum period.

When the microcomputer 7 issues the signal to the pseudo-random number generator 3, the process the encoding of the previous voice signal becomes invalid, and the encoding of the same voice signal is performed over again. This operation of the microcomputer 7 will now be described with reference to FIG. 11. First, when 32 samples representing a voice signal are stored in the voice shift register 2 in step S1, the selector circuit 3c sets the input of the XOR circuit 3b of the pseudo-random number generator 3 to the lowest significant bit (min) within the adjustable range (step S2). Next, a data train is generated by the pseudo-random number generator 3, and the encoding processing is performed sequentially (step S3), and the smallest distance is determined (step S4). Then, it is determined if the smallest distance is greater than the threshold value (step S5). If it is determined that the distance is smaller than the threshold value, the seed for the pattern is output as coded data (step S6), and the process returns to step S1 to process the next voice data.

In step S5, if it is determined that the smallest distance is greater than the threshold value, it is now checked if the selector circuit 3c has selected the highest significant bit (max) (step S7). If not yet, the selector circuit 3c is activated to move the stage upward by one position (step S8) and the encoding process in step S3 is performed over again on the same voice signal. This lengthens the period of the data train generated from the pseudo-random number generator 3, and therefore, the number of patterns to be compared with the voice signal increases, thus increasing the probability of further reducing the smallest distance. After this reencoding process, if it is determined in step S5 that the smallest distance is now smaller than the threshold value, the process proceeds to step S6 to output the seed for the pattern as coded data. However, the process cannot proceed from step S5 to step S6 as long as the smallest distance is greater than the threshold value. If, for example, the encoding has been tried four times and yet the smallest distance has not been able to be made smaller than the threshold value after the selector circuit 3c has switched to the highest significant stage, the process proceeds from step S7 to step S6, to output the seed for the last pattern as coded data. Information indicating the stage number selected by the selector circuit 3c is added to the coded data output as a result of the processing in step S6. The bit count of the seed for the coded data increases with an increase in the period of the data train.

According to this embodiment, the pseudo-random number generator 3 normally generates a data train with a short period, decreasing the bit count of the seed and thus increasing the compression ratio of the voice signal. When the quantization error becomes large, the period is lengthened as required, thus preventing a decrease of voice quality at the expense of a decrease in the compression ratio.

Figure 12:
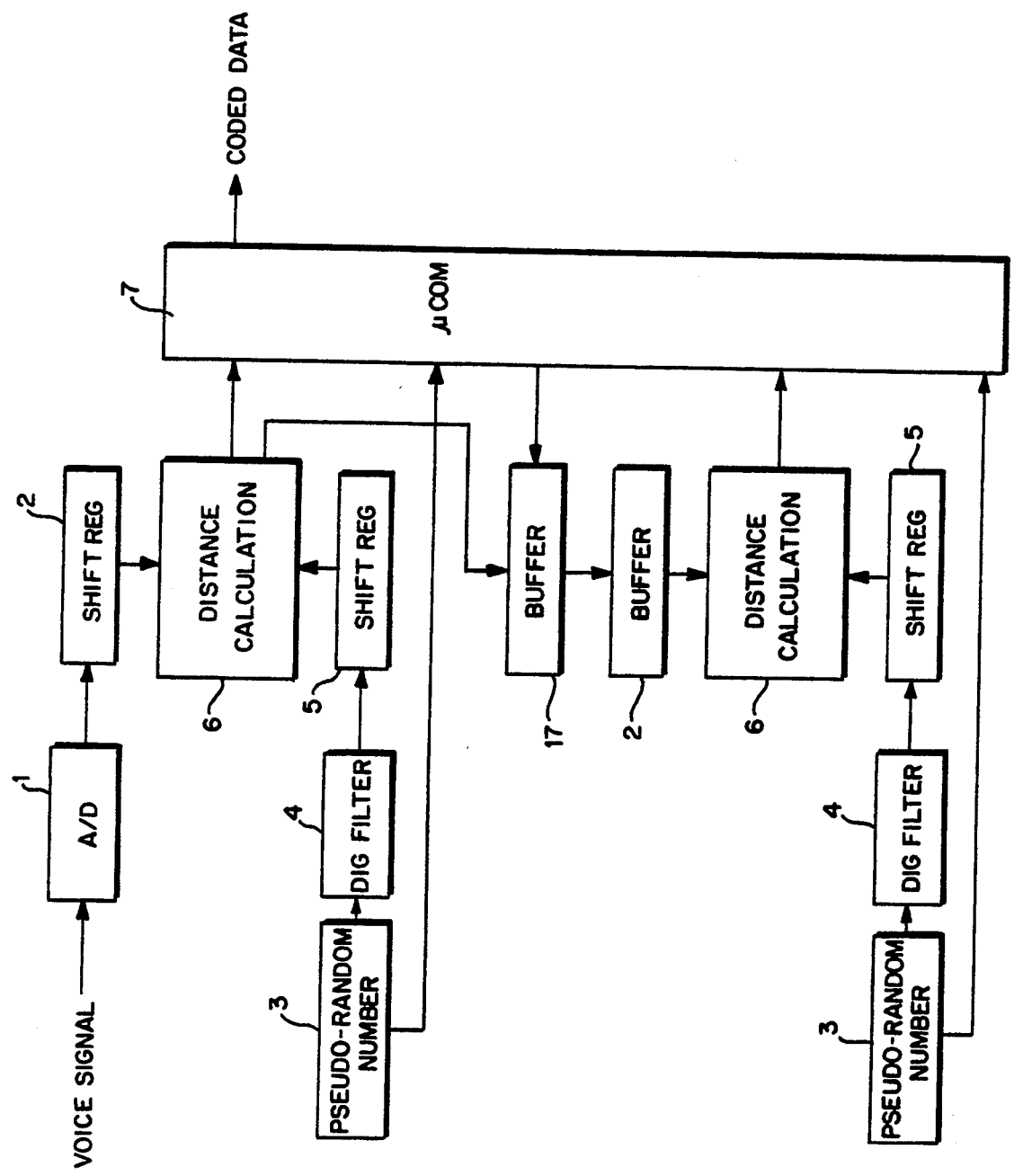
FIG. 12 is a block diagram illustrating a further embodiment of the invention.
Figure 13:
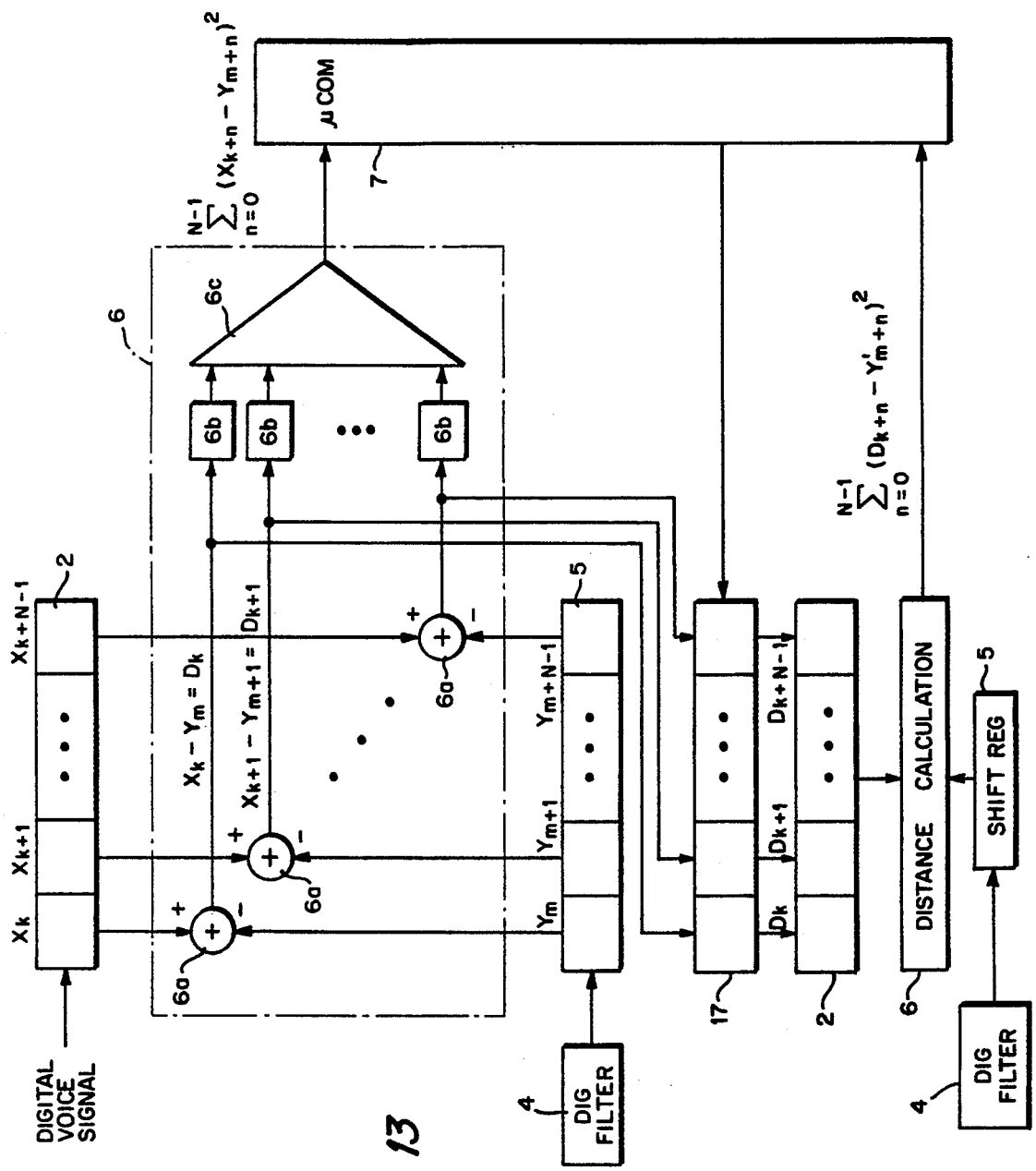
FIG. 13 is a block diagram illustrating a portion of the embodiment of FIG. 12.
Figure 14:
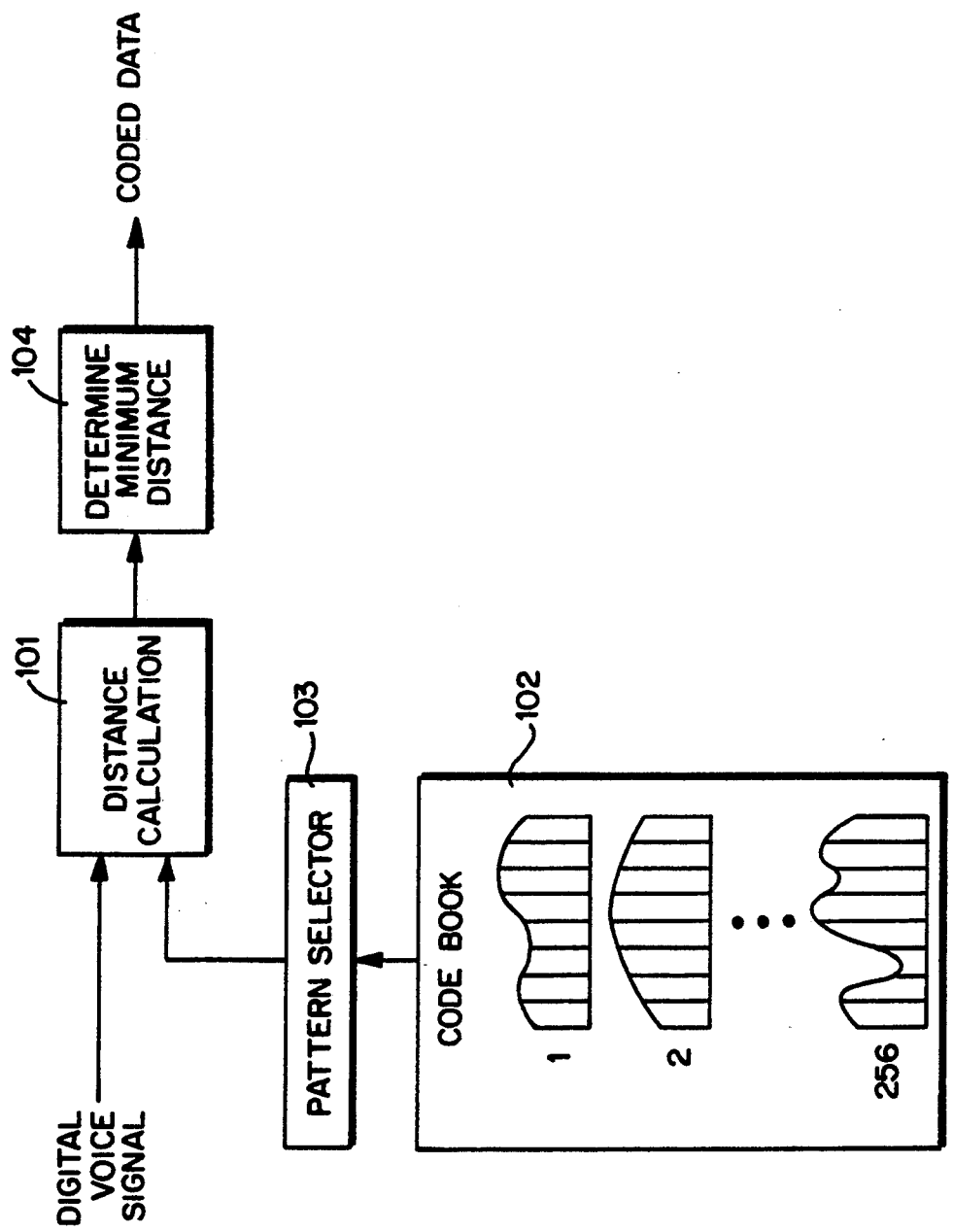
FIG. 14 shows a prior art signal encoding device.

A still further embodiment of the present invention is illustrated in FIGS. 12 and 13. In this embodiment, two processing sections are provided, as shown in FIG. 12, each comprising a voice shift register 2, a pseudo-random number generator 3, a digital filter 4, a pattern shift register 5, and a distance calculating circuit 6. As shown in FIG. 13, the distance calculating circuit 6 in one of the two sections contains a circuit which outputs the residual between the pattern and the voice signal for each sample. Between the two processing sections there is provided a buffer 17 for storing the residual signal for 32 samples. The residual signal is stored in the buffer 17 each time the distance calculating circuit 6 in one of the two sections (the first section) performs operation on each pattern. When a signal is received from a microcomputer 7, the residual signal is fed to the voice shift register 2 in the other one of the two sections (the second section). The distance for each pattern is input to the microcomputer 7 from the distance calculating circuit 6 in the first section. Only when the thus input distance is the smallest of all the distances so far input for the voice signal, does the microcomputer 7 issue a signal to the buffer 17 to cause it to deliver the corresponding residual signal to the voice shift register 2.

Therefore, when the comparison of all patterns is completed in the first section, the voice shift register 2 in the second section contains the residual signal for the pattern that provided the smallest distance. Next, the residual signal is compared with each pattern output from the digital filter 4 in the other section, and once again, the microcomputer 7 determines the smallest distance. Then, the seed for the pattern that provided the smallest distance in the first section and the seed for the pattern that provided the smallest distance in the second section are output as coded data.

Since the voice signal encoding device of this embodiment can output coded data for both the original voice signal and the residual signal, as described above, the quantization error can be reduced to enhance the voice quality. However, as the initial value for the residual signal is added to the coded data, the data compression ratio decreases. A further improvement in the voice quality may be achieved by providing three or more processing sections, each comprising a pseudo-random number generator 3, a distance calculating circuit 6, etc., and sequentially encoding the respective residual signals.

Figure 15:
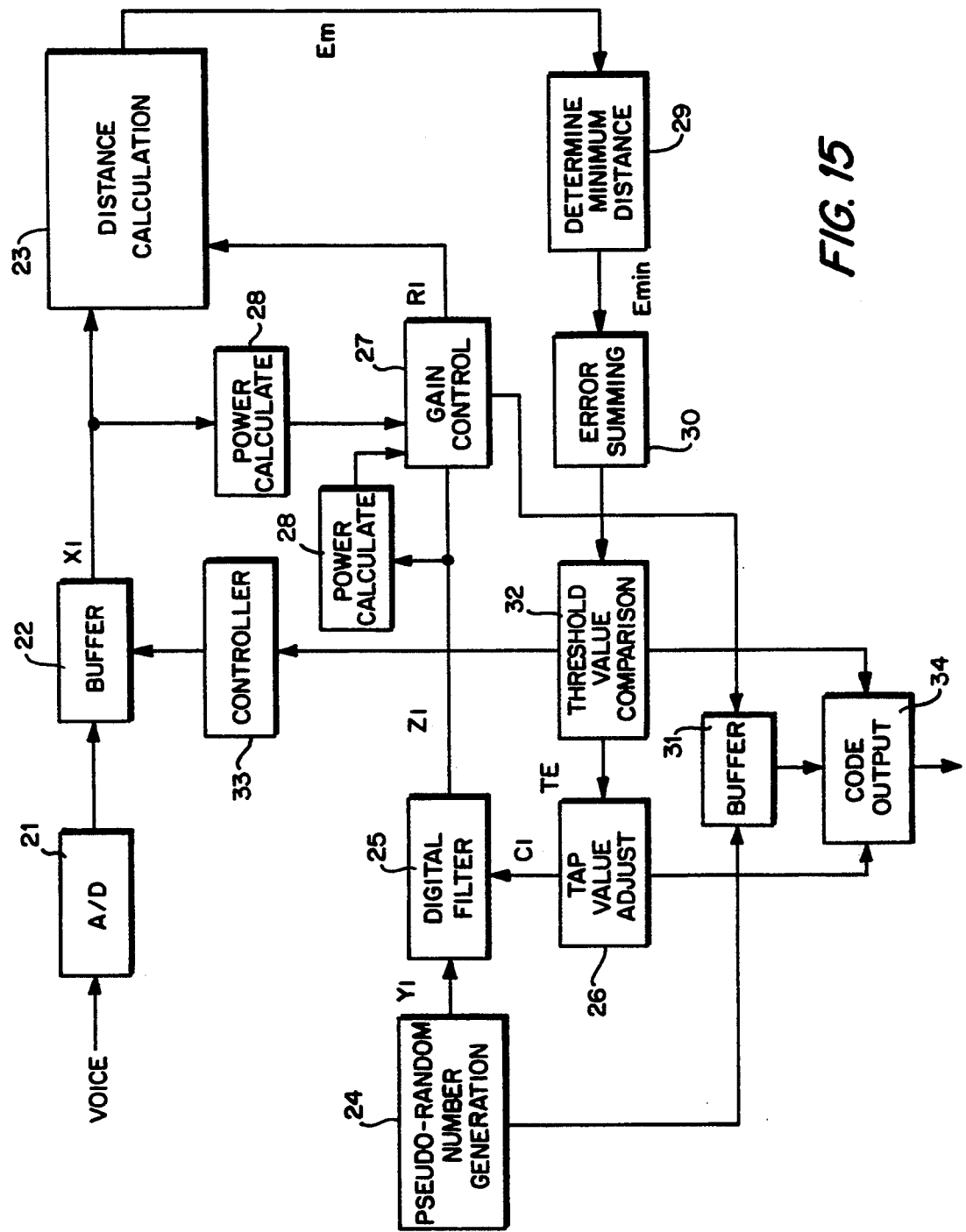
FIG. 15 is a block diagram illustrating a still further embodiment of the invention.

Another embodiment of the voice signal encoding device is illustrated in FIG. 15. In this embodiment, the input voice signal is converted into a digital signal by an A/D converter 21 which is the same as the previously mentioned A/D converter 1, and is stored temporarily in a first buffer 22. The first buffer 22 is a temporary storage circuit from which the voice signal converted to a digital signal by the A/D converter 21 is transferred in blocks of N samples to a distance calculating circuit 23. The voice signal is represented by digital data of N samples, such as $X_k, X_{k+1}, \ldots, X_{k+N-1}$, when each digital data is designated by X.

Figure 16:
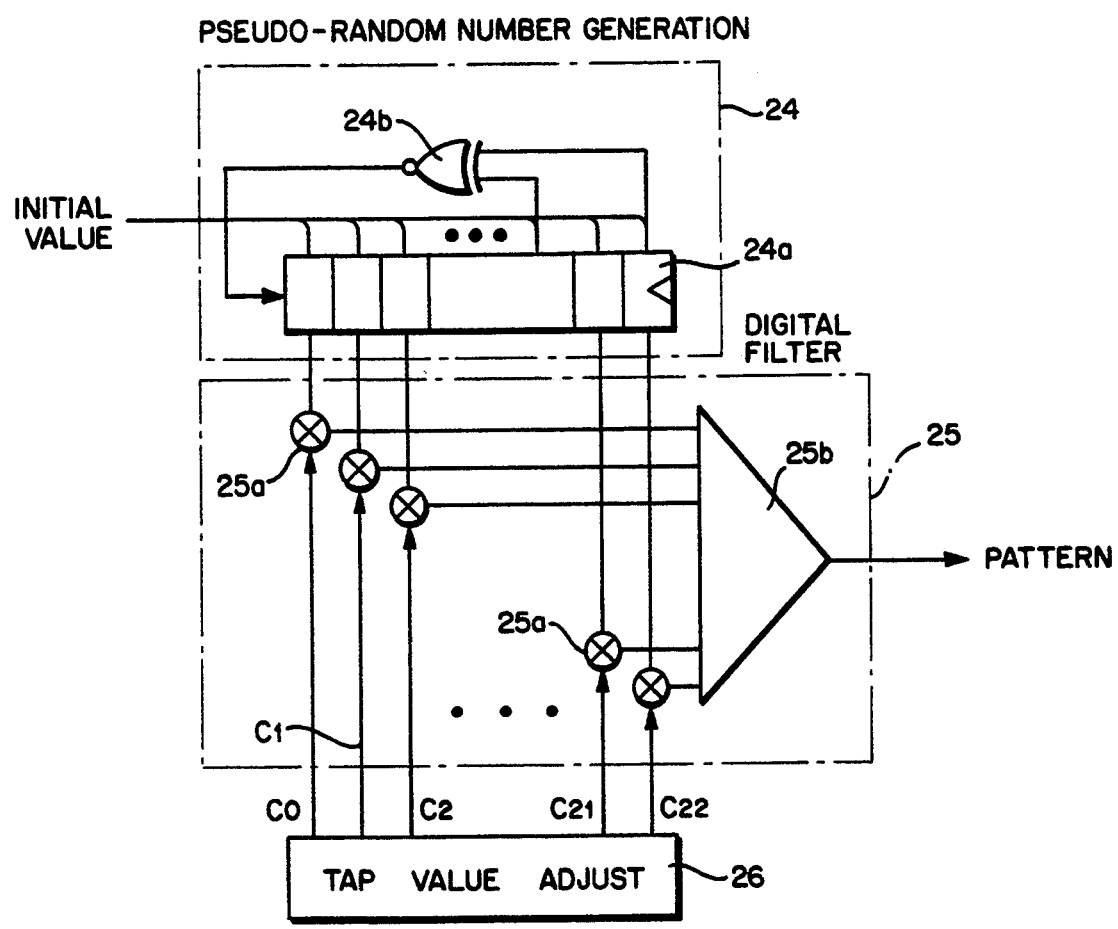
FIG. 16 is a block diagram illustrating a pseudo-random number generator and digital filter used in the embodiment of FIG. 15.

The voice signal encoding device of this embodiment is provided with a pseudo-random number generator 24. The digital data produced by the pseudo-random number generator 24 is output through a digital filter 25. A tap value adjuster 26 is provided for the digital filter 25. As shown in FIG. 16, the pseudo-random number generator 24 is a 23-bit scrambler comprising a 1-bit 23-stage shift register 24a and an XOR circuit 24b, and operates in the same manner as the previously mentioned pseudo-random number generator 3: as each bit is shifted upward by one stage, the bit in the most significant stage (the bit entered p shifts before) of the shift register 24a and a bit in a lower significant stage (the bit entered q shifts before) are XORed, the result of which is inverted and input go the least significant stage, thus realizing an M-sequence of pseudo-random numbers by the following recurrence equation:

$$Z_i = \text{not}(Z_{i-q}(+)Z_{i-p})$$

where Z is 0 or 1, and (+) is the XOR. This pseudo-random number generator 24 also is capable of producing $2^{23}$ varieties of 23-bit data.

The digital filter 25 is a circuit for limiting the bandwidth of the 23-bit digital data output from the pseudo-random number generator 24, and comprises, as shown in FIG. 16, multipliers 25a for performing multiplication by the tap value for each bit, and an adder 25b for limiting the bandwidth of the output of each multiplier 25a and converting to 16-bit digital data. Tap values $C_0$, $C_1, \ldots, C_{21}, C_{22}$ are set in the respective multipliers 25a by the tap value adjuster 26. When the tap values are varied, the bandwidth limiting characteristics of the digital filter 25 also very.

The digital filter 25 outputs the bandwidth-adjusted digital data in blocks of N samples, each block forming one pattern. The pattern whose gain is adjusted by a gain controller 27 is sent to the distance calculating circuit 23. The gain controller 27 is a circuit which controls the gain of the pattern by comparing the outputs of two power calculators 28. The power calculators 28 are circuits which respectively perform arithmetic operations on the voice signal and the pattern, i.e., squaring the 16-bit data of each sample and summing the results. The gain controller 27 controls the gain of the pattern so that these two powers match. Therefore, when N samples of digital data output from the pseudo-random number generator 24 are denoted as $Y_m, Y_{m+1}, \ldots, Y_{m+N-1}$, the pattern is denoted $Z_m, Z_{m+1}, \ldots, Z_{m+N-1}$, after its bandwidth is limited by the digital filter 25, and is denoted $R_m, R_{m+1}, \ldots, R_{m+N-1}$, after its gain is adjusted by the gain controller 27.

Figure 17:
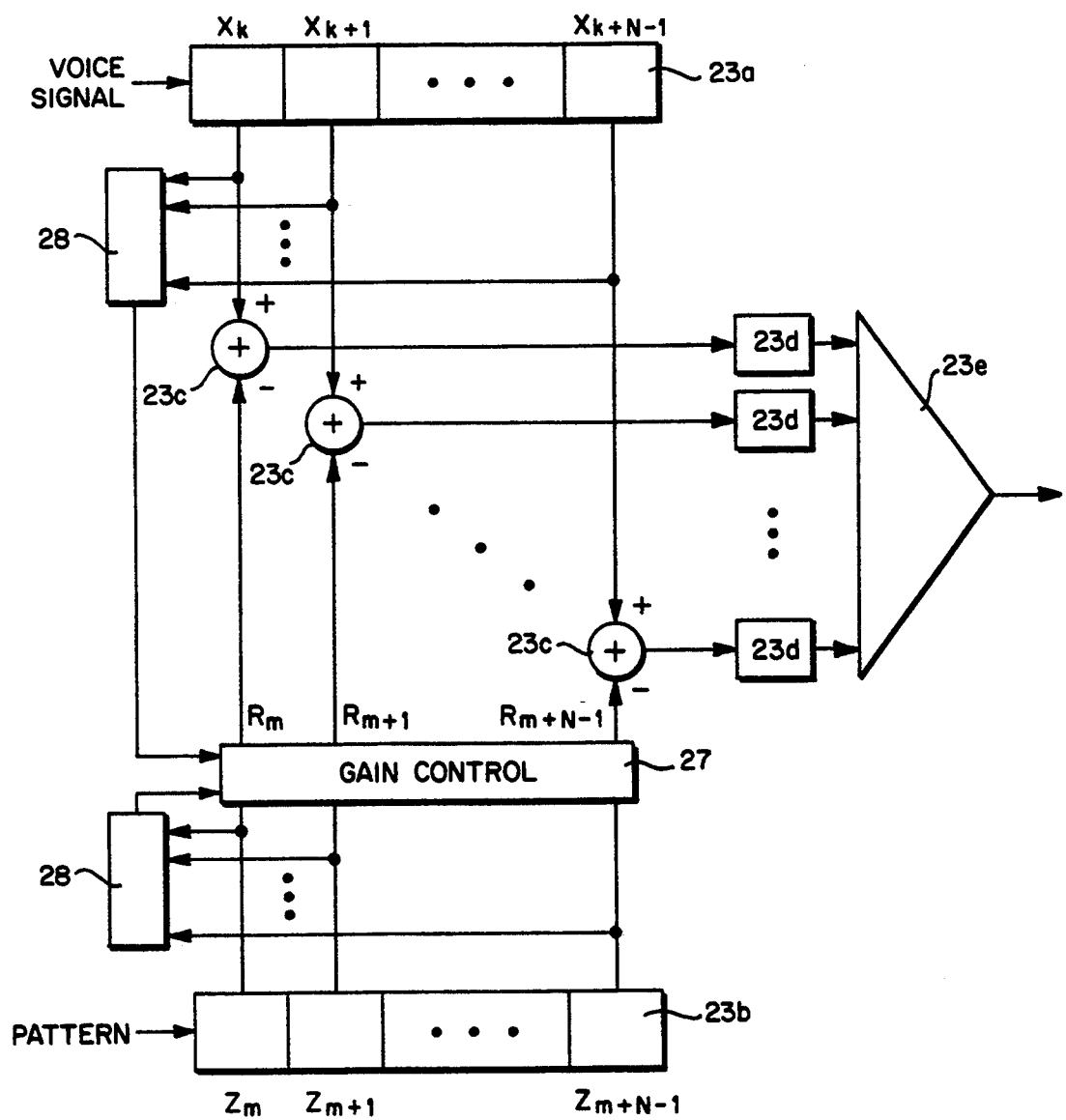
FIG. 17 is a block diagram illustrating a distance calculating circuit and gain controller used in the embodiment of FIG. 15.

The voice signal and the pattern which are input to the distance calculating circuit 23 are loaded into a voice shift register 23a and a pattern shift register 23b, respectively. The voice shift register 23a and the pattern shift register 23b are both 16-bit 32-stage shift registers. As shown in FIG. 17, in actual operation, the voice signal and the pattern are first stored in the voice shift register 23a and the pattern shift register 23b, respectively, and then their power ratio is calculated by the power calculators 28. The gain of the pattern is adjusted by the gain controller 27. Thus, the distance calculating circuit 23 calculates the distance between the voice signal stored in the voice shift register 23a and the pattern with its gain adjusted by the gain controller 27. This distance is a 32-dimensional Euclidean distance obtained by calculating the differences between the samples of the voice signal and the corresponding 16-bit data of the pattern by respective adders 23c, squaring the respective differences by multipliers 23d, and then summing the squared results by the adder 23e. The distance $E_m$ is expressed by the following equation:

$$E_m = \sum_{n=0}^{N-1} (X_{k+n} - R_{m+n})^2$$

The thus calculated distance $E_m$ between the voice signal and the pattern is sent to a minimum value identifying circuit 29. When the distance $E_m$ has thus been calculated, the pseudo-random number generator 24 sends out the next pattern through the digital filter 25 into the pattern shift register 23b, and the distance $E_m$ from the same voice signal is calculated in the same manner as above, and is given to the minimum value identifying circuit 29. This operation is repeated until all patterns are output from the pseudo-random number generator 24.

The difference $E_m$ between the voice signal and each pattern is supplied sequentially to the minimum value identifying circuit 29 which identifies the minimum value $E_{min}$ out of these distances $E_m$ and sends it to an error summing calculator 30. At the same time, the initial value set in the pseudo-random number generator 24 for the pattern that provides the distance of the minimum value $E_{min}$ and the gain adjustment amount by the gain controller 27 for that pattern are sent to a second buffer 31. After the above processing is completed, the next voice signal is transferred from the first buffer 22 to the voice shift register 23a of the distance calculating circuit 23, to repeat the same process as described above.

The error summing calculator 30 sequentially receives the minimum values $E_{min}$ each output from the minimum value identifying circuit 29 for each voice signal of N samples, and calculates the sum TE of these minimum values for a predetermined number of voice signals. The thus calculated sum TE of the minimum values is sent to a threshold value comparator 32.

The threshold value comparator 32 in which the previous minimum value sum $TE_{j-1}$ is retained calculates the difference D between the previous sum and the current sum $TE_j$ ($D = TE_{j-1} - TE_j$) to determine if the difference D is greater than the predetermined threshold value. If it is determined that the difference D is greater than the threshold value, the current minimum value sum TE is sent to the tap value adjuster 26, and a control signal is issued to a controller 33 to control the first buffer 22. When the minimum value sum TE is received, the tab value adjuster 26 updatas the tap values for the digital filter 25 by the equation $C_i = -C_i + \alpha \cdot TE$ (where $\alpha$ is a suitable constant). As a result, the band-limiting characteristics of the digital filter 25 are adjusted so as to reduce the distance between the voice signal and the pattern in the distance calculating circuit 23. On the other hand, when receiving the control signal from the threshold value comparator 32, the controller 33 sends out the same predetermined number of voice signals as that of voice signals previously sent to the distance calculating circuit 23. Therefore, the same processing as described above is performed again until the error summing calculator 30 recalculates the minimum value sum TE. When the minimum value sum TE is calculated for the first time for the voice signal, it is not possible to compare it with the previous minimum value sum. Therefore, in this case, the updating of the tap values and the recalculation of the minimum value sum may be performed unconditionally, or the minimum value sum TE first obtained may be directly compared with the threshold value.

If the threshold value comparator 32 determines that the calculated difference D is smaller than the threshold value, a code output circuit 34 outputs the initial values of the pseudo-random number generator 24 stored in the second buffer 31 and the respective gain control amounts, as coded data. The tap values for the digital filter 25 supplied by the tap value adjuster 26 are also output as part of the coded data. This means that tap value data for one data is added to the coded data in addition to the predetermined number of initial values and the gain control amount data.

To reproduce the original voice from the thus output coded data, first the tap values are set into the digital filter of the reproducing device, the initial values are given sequentially to the pseudo-random number generator, and the output patterns with their gains adjusted by the respective gain control amounts are converted to an analog signal.

Thus, according to this embodiment, a large number of patterns (representative vectors) can be generated by means of the simple pseudo-random number generator 24 comprising the shift register 24a and the exclusive OR circuit 24b, and hence there is no need to provide a code book constructed from a large-capacity memory, and also, encoding of versatile voice signals is realized. Also, since the characteristics of the digital filter 25 that limits the bandwidth of the pattern output by the pseudo-random number generator 24 are automatically optimized, the voice quality can be further enhanced. Furthermore, since only the filter tap value data is added, decrease in the compression ratio does not occur very much, and hardware of the same configuration can be used for high quality voice reproduction, thus maintaining the versatility of the hardware.

In this embodiment, the minimum value identifying circuit 29, the error summing calculator 30, and the threshold value comparator 32 are each constructed from an 8-bit microcomputer.

As is apparent from the above description, according to the invention, a large number of patterns for vector quantization are generated using a recurrence equation such as a pseudo-random sequence, and therefore there is no need to provide a large-capacity code book containing preselected patterns, thereby further enabling the hardware configuration of the device to be further simplified. Also, since the number of patterns generated can be easily increased, it is possible to reduce the quantization error and achieve versatile signal encoding. Therefore, according to the invention, the simplified hardware construction and the increased possibility for mass production serve to drastically reduce the costs of the device while providing an improvement in voice quality.

Furthermore, since the characteristics of the digital filter that limits the bandwidth of the pattern produced by the recurrence equation are automatically optimized, encoding of further enhanced quality can be achieved without impairing the versatility of the hardware. Therefore, with the simplified hardware and the increased possibility for mass production, the invention permits a drastic reduction in the costs of the device and at the same time provides encoding of high quality.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A signal encoding device comprising:
   signal dividing means for dividing a signal into subsignals each comprising a predetermined number of successive samples;
   pseudo-random data train generating means for generating pseudo-random data trains by giving initial values to a recurrence equation;
   pattern dividing means connected to the pseudo-random data train generating means for dividing the generated pseudo-random data trains into patterns each comprising the same number of samples as said predetermined number;
   distance calculating means connected to receive the patterns from the pattern dividing means and to receive the subsignals for calculating a distance between each pattern produced by said pattern dividing means and each of said subsignals; and
   minimum value identifying means connected to the distance calculating means for identifying, individually with respect to each subsignal, a pattern that provides a smallest distance and for outputting, as coded data representing the respective subsignal, an initial value set in the recurrence equation for generation by said pseudo-random data train generating means of the pseudo-random data train that constitutes said pattern.

2. A signal encoding device according to claim 1, wherein a gain of each pattern is adjusted so as to reduce the distance between the pattern and the subsignal, and said distance calculating means calculates the distance between the gain-adjusted pattern and the subsignal, and the gain adjustment amount for that pattern is also output as coded data.

3. A signal encoding device according to claim 1 or 2, wherein said distance calculating means calculates the distance between each pattern and each of said subsignals by taking, as an element of the calculation, the largest distance out of distances calculated for the respective samples of the respective subsignal and the pattern.

4. A signal encoding device according to claim 1, wherein the number of said divided samples is adjustable in both said signal dividing means and said pattern dividing means such that when the smallest distance identified by said minimum value identifying means is greater than a threshold value, the encoding processing is performed over again on the same subsignal with the number of divided samples reduced in both said signal dividing means and said pattern dividing means, and the initial value for the pattern identified as a result of the reencoding and information on the signal redivision are output as coded data.

5. A signal encoding device according to claim 1, wherein said pseudo-random data train generating means comprises a band-adjusting filter having a plurality of frequency characteristics so that a pseudo-random data train generated by the recurrence equation is subjected to a plurality of band-adjusting filter treatments with different frequency characteristics to produce a plurality of pseudo-random data trains, and the initial value for the pattern identified by said minimum value identifying means as the one providing the minimum distance and the information on the frequency characteristics of said band-adjusting filter by which that pattern was treated are output as coded data.

6. A signal encoding device according to claim 1, wherein, in said pseudo-random data train generating means, the period of the recurrence equation for generating data trains is adjustable, and when the smallest distance identified by said minimum value identifying means is greater than the threshold value, the encoding processing is performed over again on the same subsignal by lengthening the period of the recurrence equation in said pseudo-random data train generating means, and the initial value for the pattern identified as a result of the reencoding and the information on the altered period of the recurrence equation are output as coded data.

7. A signal encoding device according to claim 1, wherein said device comprises: a plurality of processing sections each comprising said signal dividing means, pseudo-random data train generating means, pattern dividing means, distance calculating means, and minimum value identifying means; and one or more residual calculating means for calculating the residual between the pattern based on the coded data output from one of said processing sections and the subsignal for each sample, said residual calculating means being respectively connected between said processing sections, said signal dividing means in another one of said processing sections using the residual calculated by said residual calculating means as a subsignal.

8. A signal encoding device comprising encoding means and coefficient optimization means,
   said encoding means comprising vector quantization means and sum calculating means, said vector quantization means having:
   (a) pattern generating means for generating patterns, each comprising a predetermined number of digital data, by sequentially setting initial values and performing a recurring calculation by a recurrence equation with each given initial value;
   (b) a digital filter for limiting the bandwidth of each pattern generated by said pattern generating means, said digital filter having one or more coefficients which are adjustable;
   (c) distance calculating means for calculating the distance between an input signal comprising a predetermined number of digital data and each of band-limited patterns output through said digital filter; and
   (d) identifying means for identifying the minimum value out of distances calculated for respective patterns by said distance calculating means, and for outputting the corresponding initial value of said pattern generating means as codes data vector quantization, said sum calculating means being connected to the identifying means for summing smallest distances identified by said identifying means for a plurality of subsections of the input signal after the implementation of said vector quantization means for each of the predetermined number of digital data, said coefficient optimization means being connected to the sum calculating means for optimizing said coefficients of digital filter for said vector quantization and directing the reimplementation of said encoding means, when the difference between the sum of the smallest distances calculated by said sum calculating means and the previous sum of the smallest distances is greater than a predetermined threshold value.

9. A signal encoding device according to claim 1, wherein a gain of each pattern is adjusted so as to reduce the distance between the pattern and the subsignal, and said distance calculating means calculates the distance between the gain-adjusted pattern and the subsignal, and the gain adjustment amount for that pattern is also output as coded data.

* * * * *

UNITED STATES PATENT AND TRADEMARK OFFICE
CERTIFICATE OF CORRECTION

PATENT NO. : 5,361,323
DATED : November 1, 1994
INVENTOR(S) : Yasumoto Murata, Shuichi Yoshikawa, Yuji Nishiwaki, Shuichi Kawama, Tomokazu Morio, and Atsunori Kitoh It is certified that error appears in the above-identified patent and that said letters patent is hereby corrected as shown below:

Column 20, line 22, before the "data trains" insert --pseudo-random--.

Signed and Sealed this

Twenty-first Day of February, 1995

Attest:

BRUCE LEHMAN

*Attesting Officer*    *Commissioner of Patents and Trademarks*